(12) United States Patent
Kang et al.

(10) Patent No.: US 12,405,341 B2
(45) Date of Patent: Sep. 2, 2025

(54) DIRECTIONAL ACOUSTIC SENSOR

(71) Applicant: SAMSUNG ELECTRONICS CO., LTD., Suwon-si (KR)

(72) Inventors: Sungchan Kang, Hwaseong-si (KR); Cheheung Kim, Yongin-si (KR); Choongho Rhee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 126 days.

(21) Appl. No.: 17/731,742

(22) Filed: Apr. 28, 2022

(65) Prior Publication Data
US 2023/0152411 A1 May 18, 2023

(30) Foreign Application Priority Data
Nov. 12, 2021 (KR) .................. 10-2021-0155987

(51) Int. Cl.
*G01S 3/801* (2006.01)
*G01S 3/803* (2006.01)
*H03H 9/13* (2006.01)

(52) U.S. Cl.
CPC .............. *G01S 3/801* (2013.01); *G01S 3/803* (2013.01); *H03H 9/132* (2013.01)

(58) Field of Classification Search
None
See application file for complete search history.

(56) References Cited

U.S. PATENT DOCUMENTS 3,886,504 A * 5/1975 Hartmann ............ H03H 9/0038
333/195
4,885,781 A * 12/1989 Seidel .................... G01H 11/06
381/174

(Continued)

FOREIGN PATENT DOCUMENTS

CN  212163296 U * 12/2020
CN  113507676 A  10/2021

(Continued)

OTHER PUBLICATIONS

Brown, Joseph J., et al. "Nonlinear Mechanics of Interlocking Cantilevers." Journal of Applied Mechanics 84.12 (2017): 121012. (Year: 2017).*

(Continued)

*Primary Examiner* — Isam A Alsomiri
*Assistant Examiner* — Jonathan D Armstrong
(74) *Attorney, Agent, or Firm* — Sughrue Mion, PLLC

(57) ABSTRACT

A directional acoustic sensor includes: a support including a first support portion and a second support portion that are separated from each other and face each other; a plurality of first resonators extending in a length direction thereof from the first support portion of the support; and a plurality of second resonators extending in the length direction thereof from the second support portion of the support and facing the plurality of first resonators, wherein each first resonator of the plurality of first resonators has a first end, wherein each second resonator of the plurality of second resonators has a second end, and wherein, in a first resonator arrangement of a region where the plurality of first resonators and the plurality of second resonators face each other, the first ends of the plurality of first resonators and the second ends of the plurality of second resonators form an intersecting structure.

23 Claims, 25 Drawing Sheets

(56) References Cited

U.S. PATENT DOCUMENTS

| | | | |
|---|---|---|---|
| 5,491,604 A * | 2/1996 | Nguyen | H03H 9/02425 333/197 |
| 5,856,722 A | 1/1999 | Haronian et al. | |
| 5,955,932 A * | 9/1999 | Nguyen | G01R 33/0286 361/278 |
| 6,012,334 A * | 1/2000 | Ando | G01H 3/08 73/648 |
| 6,079,274 A * | 6/2000 | Ando | G01H 11/08 73/649 |
| 6,236,281 B1 * | 5/2001 | Nguyen | H03H 9/02393 361/278 |
| 6,438,243 B1 * | 8/2002 | Ikeuchi | H04R 15/02 381/174 |
| 6,515,401 B1 | 2/2003 | Ando et al. | |
| 6,651,504 B1 * | 11/2003 | Datskos | G01H 11/06 73/632 |
| 8,008,105 B2 | 8/2011 | Huang | B06B 1/0292 438/52 |
| 8,103,027 B2 | 1/2012 | Zhang et al. | |
| 8,170,244 B2 | 5/2012 | Ryan et al. | |
| 9,148,729 B2 | 9/2015 | Josefsson | |
| 10,141,007 B1 | 11/2018 | Kim et al. | |
| 10,243,535 B2 * | 3/2019 | Kawasaki | H03H 9/1092 |
| 10,356,509 B2 * | 7/2019 | Park | H04R 17/025 |
| 10,541,670 B2 * | 1/2020 | Yoon | H03H 3/0076 |
| 11,146,240 B2 * | 10/2021 | Yoon | H03H 9/2426 |
| 11,359,960 B2 * | 6/2022 | Kang | H04R 17/10 |
| 2005/0005676 A1 * | 1/2005 | Crawley | B81B 3/0089 73/24.01 |
| 2011/0140579 A1 * | 6/2011 | Moon | H02N 2/186 29/25.35 |
| 2011/0215680 A1 | 9/2011 | Yamada et al. | |
| 2012/0062340 A1 * | 3/2012 | Huang | H03H 9/462 333/186 |
| 2013/0051588 A1 * | 2/2013 | Ruile | H03H 9/1457 29/25.35 |
| 2013/0135264 A1 * | 5/2013 | Black | H03H 9/178 216/13 |
| 2014/0009032 A1 * | 1/2014 | Takahashi | H03H 9/02559 29/25.35 |
| 2015/0263700 A1 * | 9/2015 | Yasumoto | H01L 28/20 310/313 B |
| 2016/0050506 A1 * | 2/2016 | Kim | H04R 1/245 381/56 |
| 2017/0006385 A1 | 1/2017 | Kim | |
| 2017/0179920 A1 * | 6/2017 | Kawasaki | H03H 9/725 |
| 2018/0097506 A1 | 4/2018 | Kang et al. | |
| 2018/0130485 A1 | 5/2018 | Park et al. | |
| 2018/0131347 A1 * | 5/2018 | Rhee | H03H 9/02259 |
| 2018/0138886 A1 | 5/2018 | Yoon et al. | |
| 2019/0033904 A1 | 1/2019 | Hong et al. | |
| 2019/0072635 A1 | 3/2019 | Kang et al. | |
| 2019/0131954 A1 * | 5/2019 | Okada | H03H 9/02992 |
| 2019/0174244 A1 | 6/2019 | Kim et al. | |
| 2019/0200119 A1 | 6/2019 | Kang et al. | |
| 2019/0348050 A1 | 11/2019 | Kim et al. | |
| 2020/0204187 A1 | 6/2020 | Hong et al. | |
| 2020/0212885 A1 | 7/2020 | Kim et al. | |
| 2022/0014172 A1 | 1/2022 | Nozoe | |
| 2023/0270010 A1 * | 8/2023 | Luo | F16K 31/006 251/129.06 |

FOREIGN PATENT DOCUMENTS

| | | |
|---|---|---|
| JP | 3729054 B2 | 12/2005 |
| JP | 6856820 B2 | 4/2021 |
| KR | 102207928 B1 | 1/2021 |

OTHER PUBLICATIONS

Communication dated Nov. 8, 2022 issued by the European Patent Office in European Application No. 22173724.0.

Kang, S., et al., "Directional Sound Sensor With Consistent Directivity and Sensitivity in the Audible Range", Journal of Microelectromechanical Systems, vol. 30, No. 3, Jun. 2021, pp. 471-479.

* cited by examiner

DIRECTIONAL ACOUSTIC SENSOR

CROSS-REFERENCE TO RELATED APPLICATION

This application is based on and claims priority under 35 U.S.C. § 119 to Korean Patent Application No. 10-2021-0155987, filed on Nov. 12, 2021, in the Korean Intellectual Property Office, the disclosure of which is incorporated by reference herein in its entirety.

BACKGROUND

1. Field

The present disclosure relates to directional acoustic sensors, and more particularly, to directional acoustic sensors including a resonator that reacts to a pressure difference in an acoustic sound.

2. Description of the Related Art

Utilization of acoustic sensors that are mounted on household appliances, video display devices, virtual reality devices, augmented reality devices, artificial intelligence speakers, etc., to detect a direction of a sound and recognize voices is increasing. Recently, a directional acoustic sensor for detecting an acoustic signal by converting a mechanical motion caused by a pressure difference into an electrical signal has been developed.

SUMMARY

Provided are directional acoustic sensors which may have improved sensitivity by increasing an acoustic resistance.

Additional aspects will be set forth in part in the description which follows and, in part, will be apparent from the description, or may be learned by practice of the presented embodiments of the disclosure.

According to an aspect of an example embodiment, a directional acoustic sensor includes: a support including a first support portion and a second support portion that are separated from each other and face each other; a plurality of first resonators extending in a length direction thereof from the first support portion of the support; and a plurality of second resonators extending in the length direction thereof from the second support portion of the support and facing the plurality of first resonators, wherein each first resonator of the plurality of first resonators has a first end, wherein each second resonator of the plurality of second resonators has a second end, and wherein, in a first resonator arrangement of a region where the plurality of first resonators and the plurality of second resonators face each other, the first ends of the plurality of first resonators and the second ends of the plurality of second resonators form an intersecting structure.

The first end of each first resonator of the plurality of first resonators may have a structure in which a partial width portion of each first resonator extends in the length direction thereof, the second end of each second resonator of the plurality of second resonators may have a structure in which a partial width portion of each second resonator that does not face the partial width portion of a corresponding first resonator extends in the length direction thereof, and a second resonator arrangement may be formed in a region where the plurality of first resonators and the plurality of second resonators face each other in a structure in which the first ends of the plurality of first resonators respectively intersect with the second ends of the plurality of second resonators.

The first ends of the plurality of first resonators and the second ends of the plurality of second resonators may respectively engage with each other.

The first ends of the plurality of first resonators and the second ends of the plurality of second resonators may respectively engage with each other in a male or female form.

The first ends of the plurality of first resonators and the second ends of the plurality of second resonators may respectively engage with each other in an edge shape.

Each first resonator of the plurality of first resonators and each second resonator of the plurality of second resonators may include a base, and a frame protruding from the base and extending in the length direction thereof.

The frame may be integrally formed with the base.

Each of the base and the frame may include silicon.

The frame may be provided on at least one of both sides and an inside of the base.

Each the first ends of the plurality of first resonators and the second ends of the plurality of second resonators may have a plate shape up to a height of the frame.

The base and the frame may extend to each of the first ends of the plurality of first resonators and each of the second ends of the plurality of second resonators.

The first end of each first resonator of the plurality of first resonators may have a structure in which a width portion of a first side of each first resonator extends in the length direction thereof, the second end of each second resonator of the plurality of second resonators may have a structure in which a width portion of a second side of each second resonator extends in the length direction thereof, and the frame may extend to end portions of the first end and the second end.

The first end of each first resonator of the plurality of first resonators may have a structure in which a width portion of a first side of each first resonator extends in the length direction thereof, the second end of each second resonator of the plurality of second resonators may have a structure in which a width portion of a second side of the second resonator that does not face the width portion of the first side of the first resonator extends in the length direction thereof, and the frame may extend to a circumference of the first end and the second end.

Each first resonator of the plurality of first resonators and each second resonator of the plurality of second resonators may include a base and a groove pattern formed in the base to a predetermined depth.

Each first resonator of the plurality of first resonators and each second resonator of the plurality of second resonators may include a base and a plurality of through holes formed in the base and having a size smaller than a wavelength of an audible frequency band.

The directional acoustic sensor may further include at least one third resonator extending in the length direction thereof from the first support portion or the second support portion of the support and not facing the plurality of first resonators or the plurality of second resonators.

The at least one third resonator may include a base and a frame protruding from the base and extending in the length direction thereof.

Each first resonator of the plurality of first resonators and each second resonator of the plurality of second resonators may include: a driving portion configured to move in response to an input sound signal; and a sensing portion configured to detect movement of the driving portion.

Each first resonator of the plurality of first resonators and each second resonator of the plurality of second resonators may include a cantilever beam having a first end fixed to the first support portion and the second support portion and a second end moving freely.

The plurality of first resonators and the plurality of second resonators may have resonant frequencies different from each other.

According to an aspect of an example embodiment, there is provided an electronic device including a directional acoustic sensor including: a support including a first support portion and a second support portion that are separated from each other and face each other; a plurality of first resonators extending in a length direction thereof from the first support portion of the support; and a plurality of second resonators extending in the length direction thereof from the second support portion of the support and facing the plurality of first resonators, wherein each first resonator of the plurality of first resonators has a first end, wherein each second resonator of the plurality of second resonators has a second end, and wherein, in a first resonator arrangement of a region where the plurality of first resonators and the plurality of second resonators face each other, the first ends of the plurality of first resonators and the second ends of the plurality of second resonators form an intersecting structure.

The directional acoustic sensor may further include at least one third resonator extending in the length direction thereof from the first support portion or the second support portion of the support and not facing the plurality of first resonators or the plurality of second resonators.

The at least one third resonator may include a base and a frame protruding from the base and extending in the length direction thereof.

Each first resonator of the plurality of first resonators and each second resonator of the plurality of second resonators may include: a driving portion configured to move in response to an input sound signal, and a sensing portion configured to detect movement of the driving portion.

Each first resonator of the plurality of first resonators and each second resonator of the plurality of second resonators may include a cantilever beam having a first end fixed to the first support portion and the second support portion and a second end moving freely.

The plurality of first resonators and the plurality of second resonators may have resonant frequencies different from each other.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
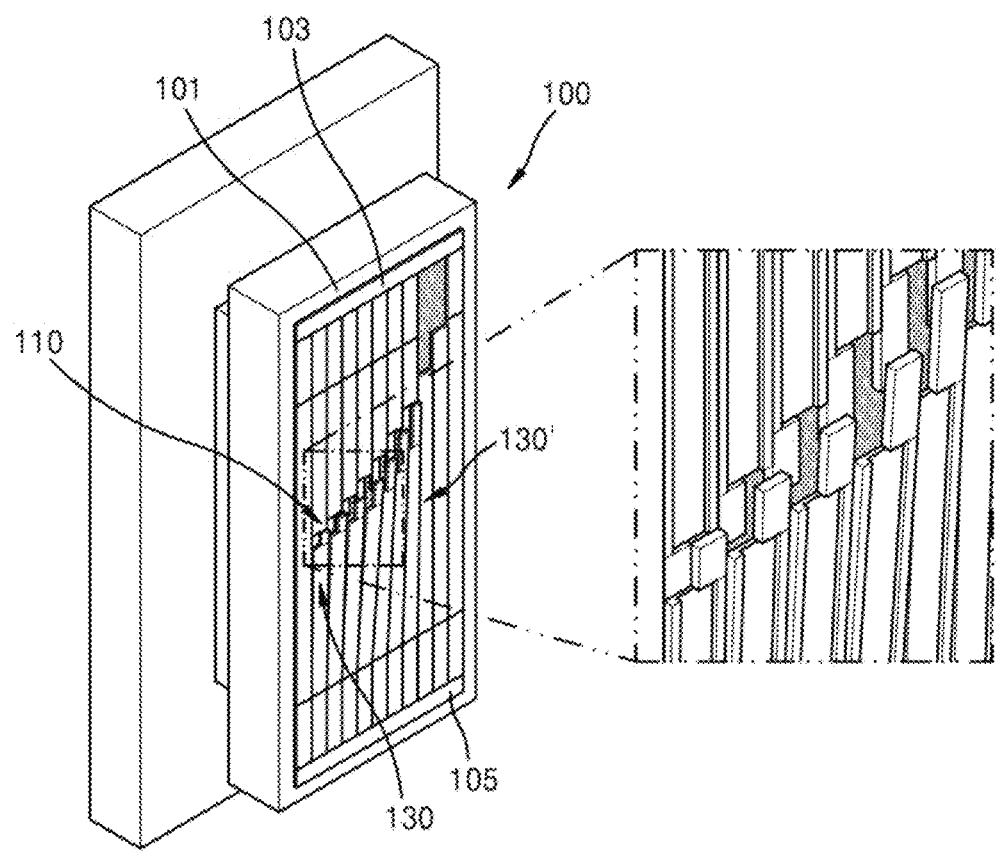
FIG. 1 is a perspective view exemplarily illustrating a directional acoustic sensor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In the drawings, like reference numerals refer to like elements, and the size of each component may be exaggerated for clarity and convenience of explanation. The embodiments of the inventive concept are capable of various modifications and may be embodied in many different forms.

When an element or layer is referred to as being "on" or "above" another element or layer, the element or layer may be directly on another element or layer or intervening elements or layers. The singular forms "a," "an" and "the" are intended to include the plural forms as well, unless the context clearly indicates otherwise. When a part "comprises" or "includes" an element in the specification, unless otherwise defined, it is not excluding other elements but may further include other elements.

The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

The connections of lines and connection members between constituent elements depicted in the drawings are examples of functional connection and/or physical or circuitry connections, and thus, in practical devices, may be expressed as replicable or additional functional connections, physical connections, or circuitry connections.

The use of any and all examples, or exemplary language provided herein, is intended merely to better illuminate the inventive concept and does not pose a limitation on the scope of the inventive concept unless otherwise claimed.

A directional acoustic sensor according to an embodiment uses a principle of a resonator that responds to a pressure difference in an acoustic sound, and includes a combination of resonators having different resonant frequencies. Each of the resonators may be formed of a cantilever beam having one end fixed to a support and the other end moving freely, and the resonant frequency of each resonator may be determined by a length of the resonator or a concentration mass of the resonator.

The relationship between the characteristics of the cantilever-type resonator and the resonance frequency may be expressed as Equation (1).

$$\omega_0 = (1.875^2)\sqrt{EI/mL^3} \quad (1)$$

Here, $\omega_0$ indicates resonance frequency, E indicates effective modulus, $$\left[\left(I = \frac{1}{12}bt^3\right)\right]$$

indicates moment of inertia, b indicates beam width, t is beam thickness, and m indicates effective mass, and L indicates beam length.

When a length of a resonator is the same and a mass is changed, a bandwidth of the resonator may be reduced. This is because if the mass is increased to lower a frequency, a Q-factor increases and the bandwidth decreases. Therefore, in order to implement the same bandwidth characteristics even though the frequencies are different from each other, the adjustment of a resonant frequency by changing the length of the resonator is suitable for designing a directional acoustic sensor with a wide frequency band. When a required resonance frequency is designed, the number and length of resonators may be determined and the size of a device may be determined. However, when resonators having lengths different from each other are arranged, a through hole may be generated. The through hole may reduce an acoustic resistance, thereby reducing a pressure difference in acoustic sound, and may be a factor of lowering sensitivity.

According to the directional acoustic sensor according to an embodiment, a through-hole portion of a cavity may be minimized by forming a resonator arrangement in which a plurality of resonators face each other, and forming the resonator arrangement in a structure in which ends of two facing resonators intersect each other. By reducing or almost eliminating a through-hole portion by such an arrangement of the resonator, a decrease in sensitivity due to a decrease in acoustic resistance may be prevented, and the element size of the directional acoustic sensor may also be reduced.

Figure 2:
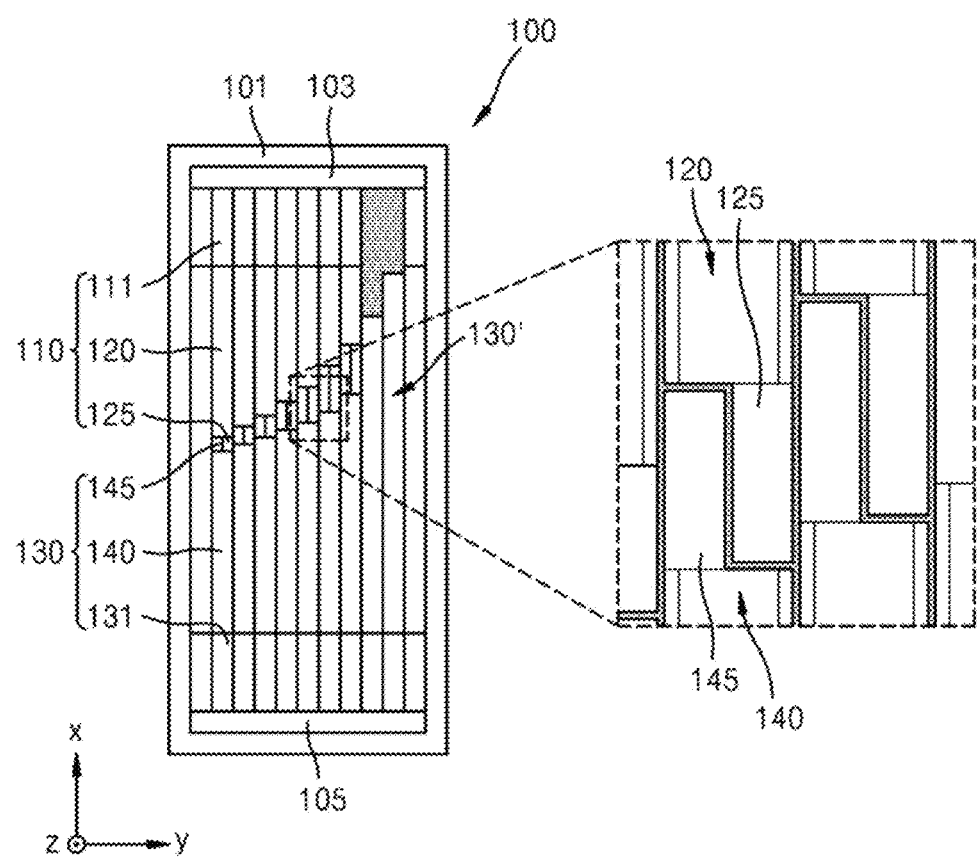
FIG. 2 is a plan view of the directional acoustic sensor of FIG. 1 according to an example embodiment.

FIG. 1 is a perspective view illustrating a directional acoustic sensor according to an example embodiment. FIG. 2 is a plan view of the directional acoustic sensor of FIG. 1 according to an example embodiment.

Referring to FIGS. 1 and 2, the directional acoustic sensor 100 includes a support 101 and a plurality of first resonators 110 and a plurality of second resonators 130 provided on the support 101. The directional acoustic sensor 100 according to the embodiment may include at least one third resonator 130' provided on the support 101, although in some embodiments, the at least one third resonator 130' is not included.

The support 101 is formed to include a cavity that penetrates therethrough, and includes first and second support portions 103 and 105 facing each other with the cavity therebetween. A separation distance between the first and second support portions 103 and 105 may correspond to a width of the cavity in a length direction of the directional acoustic sensor 100.

The support 101 may be, for example, a silicon substrate, but is not limited thereto. The plurality of first resonators 110 and the plurality of second resonators 130 may be arranged in the cavity of the support 101 in a predetermined shape. For example, the plurality of first resonators 110 and the plurality of second resonators 130 may be arranged to form a resonator arrangement to face each other in the cavity of the support 101. The at least one third resonator 130' may be arranged in a predetermined shape in the cavity of the support 101 so as not to face the first resonator 110 or the second resonator 130.

One end of each of the plurality of first resonators 110 may be fixed to the first support portion 103 of the support 101 to form a planarly parallel arrangement in the cavity of the support 101. One end of each the plurality of second resonators 130 may be fixed to the second support portion 105 of the support 101 to form the planarly parallel arrangement in the cavity of the support 101. One end of the at least one third resonator 130' may be fixed to, for example, the second support portion 105 of the support 101 to form the planarly parallel arrangement in the cavity of the support 101. Here, one end of the third resonator 130' may be fixed to the first support portion 103 of the support 101.

Each of the plurality of first resonators 110 may extend in the length direction thereof from the first support portion 103 of the support 101. Each of the plurality of second resonators 130 may extend in the length direction thereof with respect to the second support portion 105 of the support 101, and may be arranged to face the plurality of first resonators 110. The at least one third resonator 130' may extend in the length direction thereof from the second support portion 105 towards the first support portion 103.

FIGS. 1 and 2 show an example arrangement in which the plurality of first resonators 110 and the plurality of second resonators 130 face each other, and the third resonator 130' that does not face the first resonator 110 is included.

As another example, the plurality of first resonators 110 and the plurality of second resonators 130 are arranged to face each other, and the at least one third resonator 130' may be arranged not to face the second resonator 130. As another example, the number of first resonators 110 is the same as the number of second resonators 130, the plurality of first resonators 110 and the plurality of second resonators 130 are all arranged to face each other, and the at least one third resonator 130' that does not face the first resonator 110 or the second resonator 130 is not included. Hereinafter, a case in which the directional acoustic sensor 100 according to an embodiment further includes the at least one third resonator 130' that does not face the first resonator 110, and the third resonator 130' is arranged parallel to the second resonator 130 will be described as an example.

Here, the length direction is a direction corresponding to the length of each of the resonators, that is, the first resonator 110, the second resonator 130, and the third resonator 130', may correspond to a direction from the first support portion 103 to the second support portion 105 or correspond to a direction from the second support portion 105 to the first support portion 103. That is, the length direction may correspond to a direction (x-axis direction) crossing the first support portion 103 and the second support portion 105.

Each of the plurality of first resonators 110 may constitute a cantilever beam in which one end is fixed to the first support portion 103 of the support 101 and the other end freely moves. Each of the plurality of second resonators 130 and the at least one third resonator 130' may form a cantilever beam in which one end is fixed to the second support portion 105 of the support 101 and the other end freely moves. FIGS. 1 and 2 illustrate a case in which the plurality of first resonators 110, the plurality of second resonators 130, and the at least one third resonator 130' move in a z-axis direction. FIG. 1 exemplarily illustrates a state in which some portion of the second resonator 130 are moved by an input acoustic sound.

Each of the plurality of first resonators 110 includes a driving portion 120 configured to vibrate in response to an input sound signal, and a sensing portion configured to detect a movement of the driving portion 120. Each of the plurality of second resonators 130 includes a driving portion 140 configured to vibrate in response to an input sound signal, and a sensing portion configured to detect a movement of the driving portion 140. The driving portions 120 and 140 of each of the plurality of first resonators 110 and the plurality of second resonators 130 may be configured as a cantilever beam.

One end of the driving portion 120 of each of the plurality of first resonators 110 may be fixed to the first support portion 103 of the support 101, and extend in the length direction of the first resonator 110 from the first support portion 103 toward the cavity. The driving portion 120 may be integrally formed with the support 101, and in this case, the driving portion 120 may include, for example, silicon. However, the present embodiment is not limited thereto, and the driving portion 120 may not be integrally formed with the support 101. The driving portion 120 of each of the plurality of first resonators 110 may have a first end 125 at an end thereof.

One end of a driving portion 140 of each of the plurality of second resonators 130 and the at least one third resonator 130' may be fixed to the second support portion 105 of the support 101, and may extend in the length direction (an x-axis direction in FIGS. 1 and 2) of the second and third resonators 130 and 130' from the second support portion 105 toward the cavity. The driving portion 140 may be integrally formed with the support 101, and in this case, the driving portion 140 may include, for example, silicon. However, the present embodiment is not limited thereto, and the driving portion 140 may not be integrally formed with the support 101. The driving portion 140 of each of the plurality of second resonators 130 may have a second end 145 at the end thereof.

An effective length of the first resonator 110 is a vibrating length of the driving portion 120, and may include a length of the first end 125. An effective length of the second resonator 130 is a vibrating length of the driving portion 140, and may include a length of the second end 145.

The directional acoustic sensor 100 according to the embodiment is configured such that the first end 125 and the second end 145 of the first resonator 110 and the second resonator 130 that face each other form an intersecting structure. The length of each of the first end 125 and the second end 145 for the intersecting structure may be formed up to approximately half of the effective length of each of the first resonator 110 and the second resonator 130. That is, the length of each of the first and second ends 125 and 145 forming the intersecting structure of the first and second resonators 110 and 130 facing each other may be up to about half the length of each of the first and second resonators 110 and 130.

Sensing portions 111 and 131 may be provided on one surface of each of the driving portions 120 and 140 to detect the movement of the driving portions 120 and 140. The sensing portions 111 and 131 may include, for example, a piezoelectric element that generates electric energy by deformation of the piezoelectric material. In this case, each of the sensing portions 111 and 131 may include two electrodes and a piezoelectric layer provided between the two electrodes.

The first end 125 of the first resonator 110 and the second end 145 of the second resonator 130 disposed to face each other may respectively correspond to the end of the cantilever beam, which is the driving portion 120 or 140.

The directional acoustic sensor 100 according to the embodiment includes a resonator arrangement region in which the first resonator 110 and the second resonator 130 face each other, and in the resonator arrangement to face each other, the first resonator 110 and the second resonator 130 may be arranged to form a structure in which the first end 125 and the second end 145 intersect each other.

For example, the first resonator 110 and the second resonator 130 that face each other may have a resonator arrangement such that the first end 125 of the first resonator 110 has a structure in which a width portion of one side of the first resonator 110 extends in the length direction thereof, the second end 145 of the second resonator 130 has a structure in which a width portion of the other side of the second resonator 130 that does not face the width portion of the one side of the first resonator 110 extends in the length direction thereof, and the first end 125 of the first resonator 110 and the second end 145 of the second resonator 130 have an intersecting structure.

In this case, the first end 125 and the second end 145 may be engaged with each other. The first resonator 110 and the second resonator 130 may be arranged facing each other such that the first end 125 and the second end 145 are engaged with each other, but direct collision does not occur and a gap between them is minimized. In this way, when the first end 125 and the second end 145 of the first resonator 110 and the second resonator 130 that face each other form an intersecting structure engaged with each other, in the arrangement region where the first resonator 110 and the second resonator 130 face each other, a through-hole portion of the cavity may be reduced or almost absent, and thus, a decrease in sensitivity due to a decrease in an acoustic resistance may be prevented, the sensitivity for sensing acoustic sound may be improved, and the device size of the directional acoustic sensor 100 may be reduced.

The first end 125 of the first resonator 110 and the second end 145 of the second resonator 130 disposed to face each other may have the same length or different lengths, and a sum of widths of the first end 125 and the second end 145 may be less than half of a sum of a maximum width of the first resonator 110 and a maximum width of the second resonator 130.

For example, consider a case in which the maximum width of the first resonator 110 and the second resonator 130 disposed to face each other is equal to W. In this case, when the first resonator 110 and the second resonator 130 facing each other are arranged to form an intersecting structure in which the first end 125 and the second end 145 are engaged with each other, the sum of the width of the first end 125 and the width of the second end 145 may be less than or equal to W such that a gap between the first end 125 and the second end 145 is minimized without collision between the first end 125 and the second end 145. In this case, the first end 125 and the second end 145 of the first resonator 110 and the second resonator 130 facing each other may have the same length or different lengths, and the width of the first end 125 may be the same as or different from the width of the second end 145. For example, the first end 125 and the second end 145 of the first resonator 110 and the second resonator 130 facing each other may be the same width, and may have a width equal to or less than W/2, respectively. When a gap between the first end 125 and the second end 145 intersecting each other is large, an acoustic resistance may be reduced, and thus, the shape, length, and width of the first end 125 of the first resonator 110 and the second end 145 of the second resonator 130 arranged to intersect each other may be determined such that the decrease in sensitivity is prevented by suppressing the decrease in acoustic resistance and a desired resonant frequency is realized without collision between the first end 125 and the second end 145 engaged with each other.

FIGS. 1 and 2 exemplarily illustrate an arrangement in which the plurality of first resonators 110 and the plurality of second resonators 130 are disposed to face each other, and the at least one third resonator 130' does not face the first resonator 110. In the case of the third resonator 130' that does not face the first resonator 110, the second end 145 having a different shape may not be provided as exemplarily shown in FIGS. 1 and 2. For example, the third resonator 130' may be formed to have a constant width. As another example, similar to the second resonator 130 facing the first resonator 110, even in the case of the third resonator 130' not facing the first resonator 110, the second end 145 having a different shape may be provided.

The plurality of first resonators 110, the plurality of second resonators 130, and the at least one third resonator 130' may sense sound frequencies of different bands. That is, the plurality of first resonators 110 may be configured to have different resonance frequencies. To this end, the plurality of first resonators 110 may have dimensions different from each other. For example, the plurality of first resonators 110 may have lengths, widths, or thicknesses different from each other. Also, the plurality of second resonators 130 may be configured to have different resonance frequencies. To this end, the plurality of second resonators 130 may have dimensions different from each other. For example, the plurality of second resonators 130 may have lengths, widths, or thicknesses different from each other. In addition, the shapes, lengths, and widths of the first end 125 of the first resonator 110 and the second end 145 of the second resonator 130 arranged to intersect each other may be determined so as to realize a desired resonant frequency without collision between the first end 125 and the second end 145 that intersect each other. Also, the at least one third resonator 130' may be configured to have a different resonance frequency. To this end, the at least one third resonator 130' may have a different dimension. For example, the at least one third resonator 130' may have a different length, width, or thickness.

FIGS. 1 and 2 illustrate, as an example, a case in which the plurality of first resonators 110 have different lengths from each other, the plurality of second resonators 130 have different lengths from each other, the maximum widths of the first resonator 110 and the second resonator 130 are equal to W, and the first end 125 and the second end 145 have the same width of W/2 or less. The directional acoustic sensor 100 according to the present embodiment may have a directivity, for example, bi-directionality in a z-axis direction.

Figure 3A:
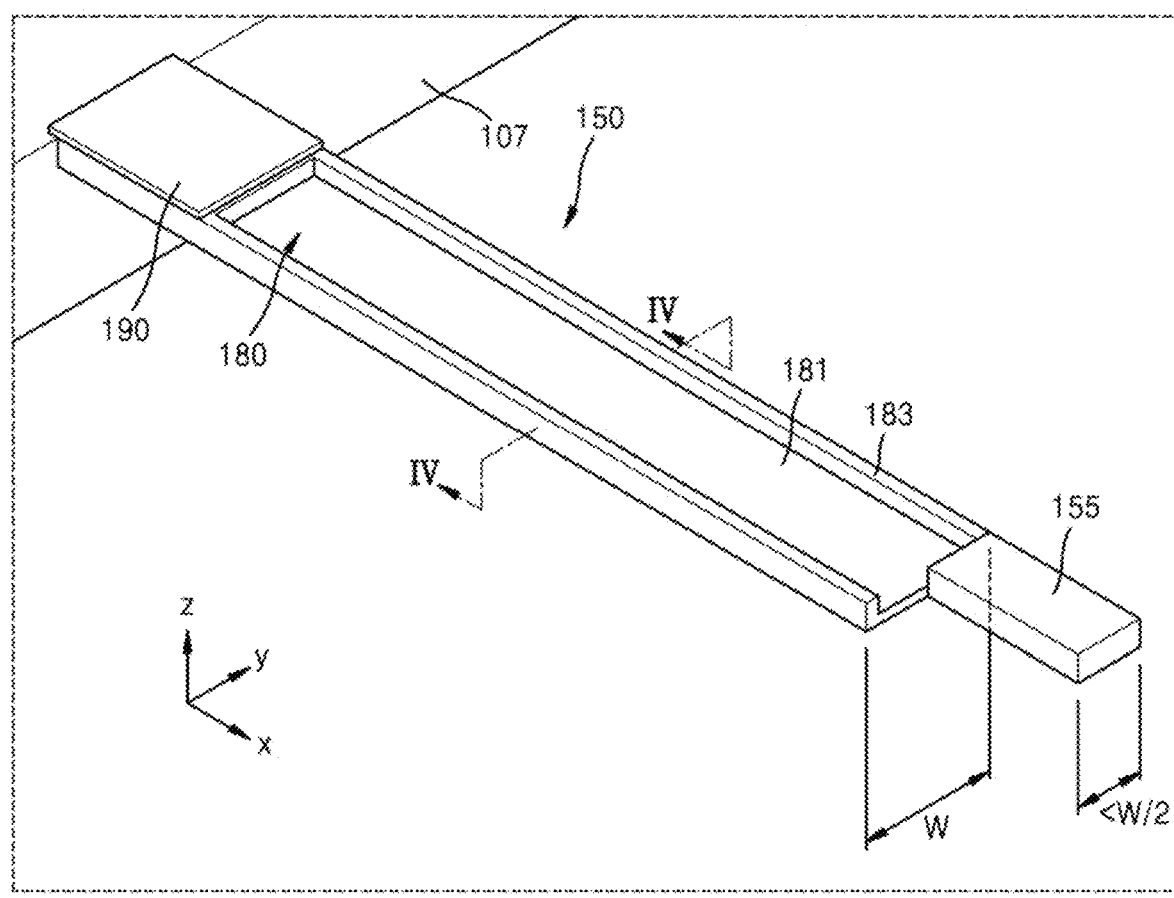
FIGS. 3A, 3B and 3C are diagrams of resonators applicable to first and second resonators of FIGS. 1 and 2 according to example embodiments.
Figure 3B:
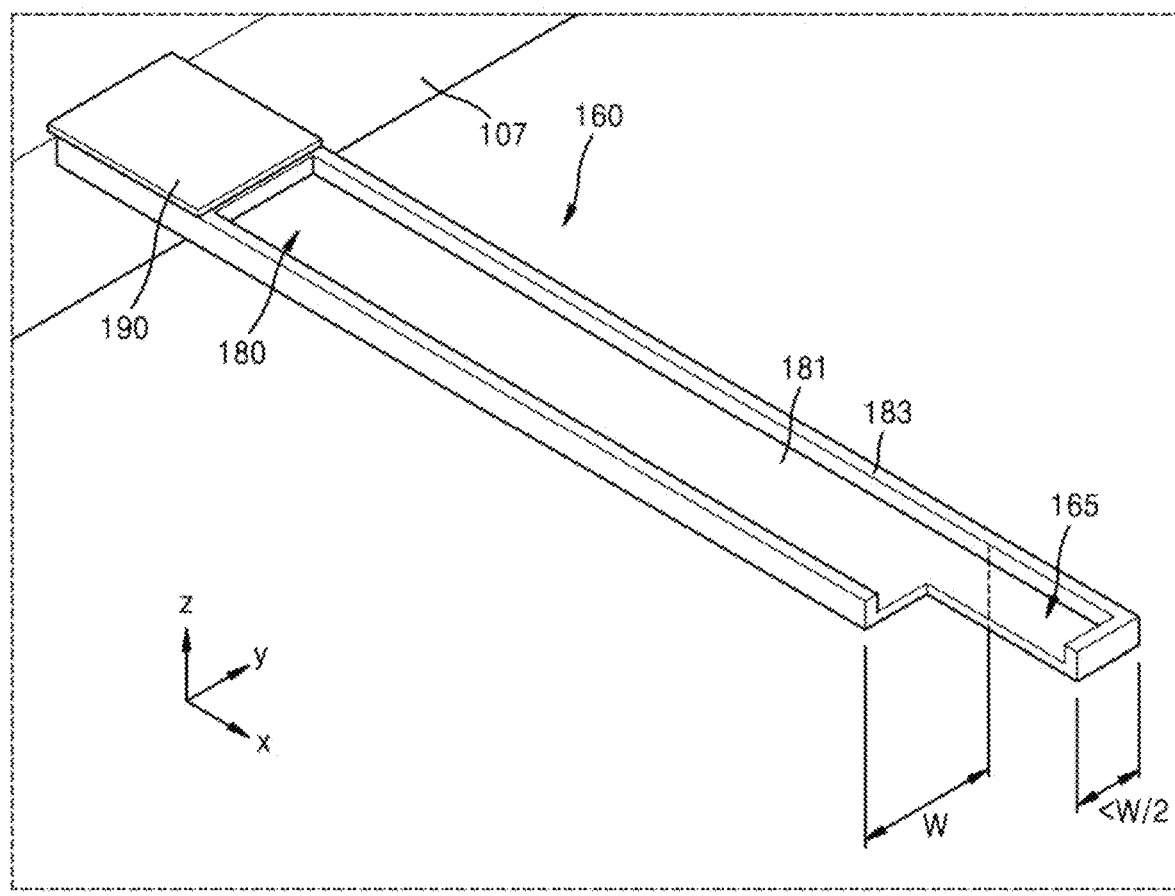
Figure 3C:
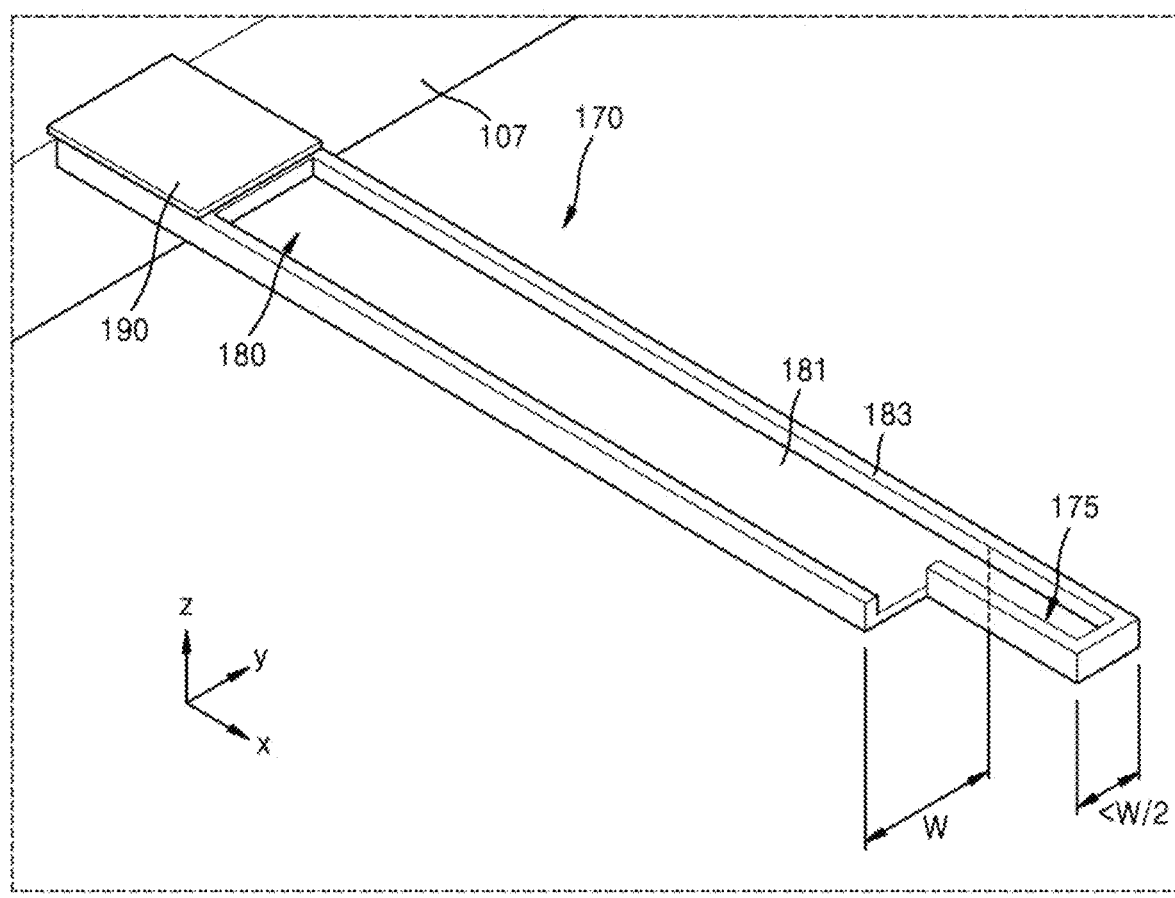
Figure 3D:
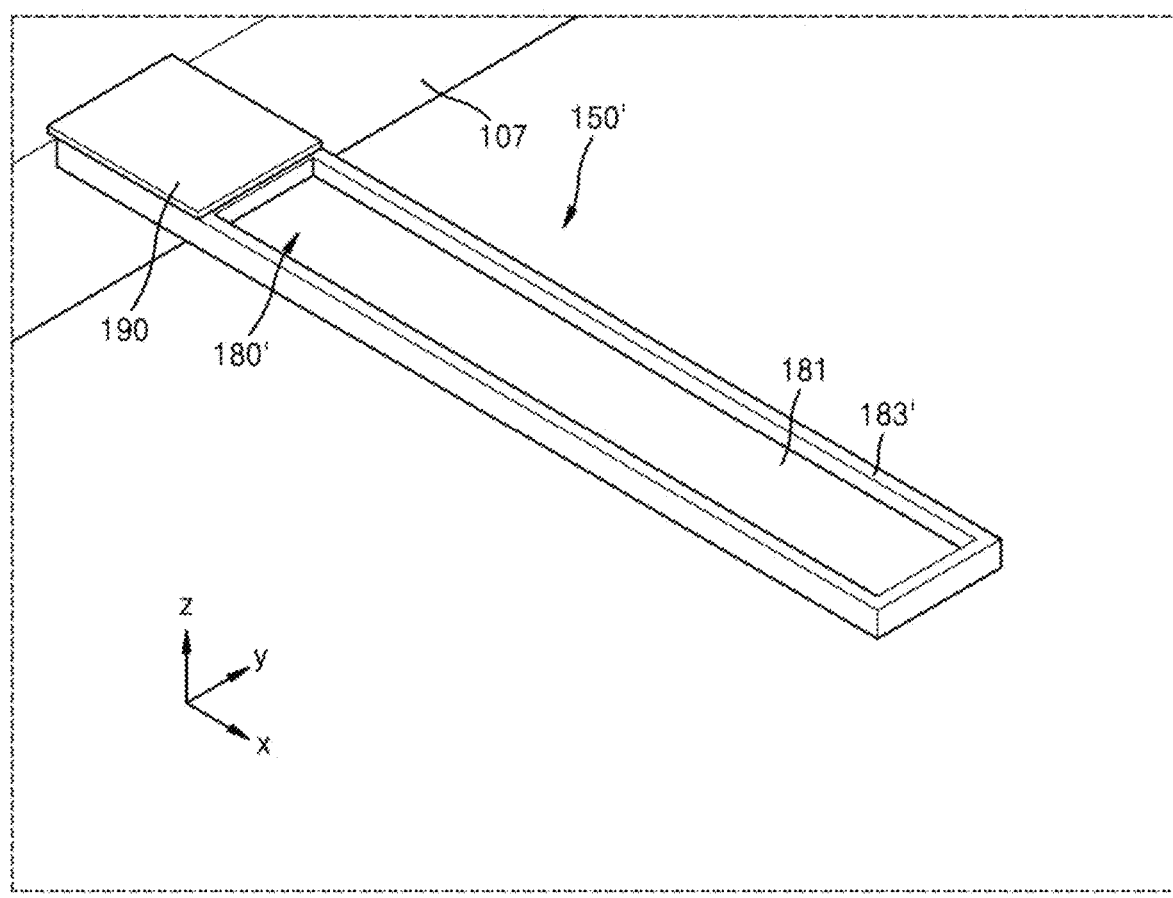
FIG. 3D is a diagram of an example of a resonator applicable to a third resonator of FIGS. 1 and 2 according to an example embodiment.
Figure 4:
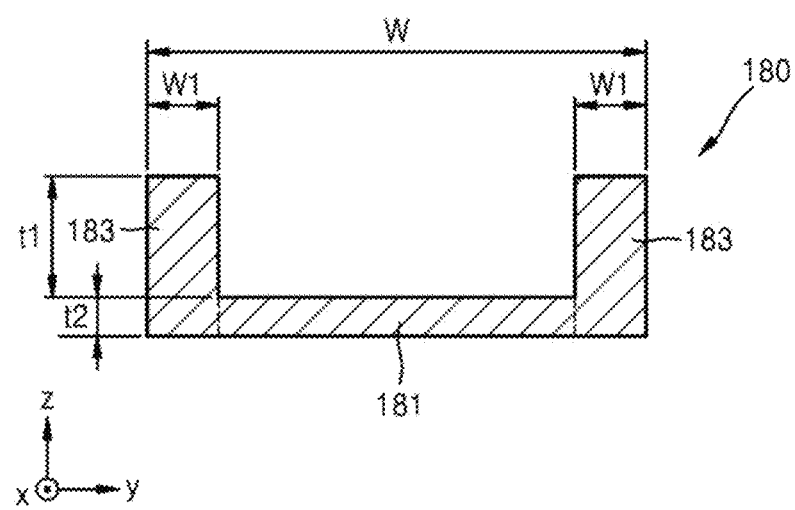
FIG. 4 is a cross-sectional view taken along line IV-IV of FIG. 3A according to an embodiment.

FIGS. 3A to 3C illustrate various examples of resonators 150, 160, 170 that may be applied as the first resonator 110 and the second resonator 130 facing each other in FIGS. 1 and 2 according to embodiments. FIG. 3D illustrates an example of a resonator 150' that may be applied as the third resonator 130' that does not face the first resonator 110 in FIGS. 1 and 2 according to an embodiment. FIG. 4 is a cross-sectional view taken along line IV-IV of FIG. 3A, which corresponds to a cross-sectional view of the resonators 150, 150', 160, and 170 of FIGS. 3A to 3D according to an embodiment. As a third resonator 130' that does not face the first resonator 110, the resonators 150, 160, and 170 of FIGS. 3A to 3C may be applied instead of the resonator 150' of FIG. 3D.

Referring to FIGS. 3A to 3D, each of the resonators 150, 150', 160, and 170 includes a driving portion 180 that vibrates in response to an acoustic signal, and a sensing portion 190 detecting a movement of the driving portion 180.

The driving portion 180 of each of the resonators 150, 150', 160, and 170 is configured of a cantilever beam, and may extend in a length direction (x-axis direction in FIGS. 1 and 2) of the resonators 150, 150', 160, 170 from a support 107 (corresponding to the first support portion 103 or the second support portion 105 in FIGS. 1 and 2) toward a cavity. One end of the driving portion 180 may be fixed to the support portion 107 of a support. The driving portion 180 may be integrally formed with the support, and in this case, the driving portion 180 may include, for example, silicon. However, the present embodiment is not limited thereto, and the driving portion 180 may not be formed integrally with the support. The sensing portion 190 may be provided on one surface of the driving portion 180 to detect the movement of the driving portion 180. The sensing portion 190 may include a piezoelectric element that generates electric energy by deformation of the piezoelectric material. In this case, the sensing portion 190 may include two electrodes and a piezoelectric layer provided between the two electrodes.

The driving portion 180 of the resonators 150, 160, 170 may include a base 181 and a frame 183 protruding from the base 181 and extending in the length direction thereof. The driving portion 180' of the resonators 150' may include a base 181 and a frame 183' protruding from the base 181 and extending in the length direction thereof.

Referring to FIGS. 3A to 3C, the driving portions 180 of the resonators 150, 160, and 170 respectively have ends 155, 165, and 175 at end portions thereof (corresponding to the first end 125 and the second end 145 in FIGS. 1 and 2). Referring to FIG. 3D, the driving portion 180' of the resonator 150' may be formed such that the frame 183' extends also to an end portion of the base 181. In the driving portion 180/180' of the resonators 150, 160, and 170/150', the frame 183/183' may be integrally formed with the base 181, and the ends 155, 165, and 175 may also be integrally formed with the base 181 and the frame 183. The base 181 and the frame 183/183' may include silicon, and the ends 155, 165, and 175 may also include silicon.

The frame 183/183' may be provided on at least one of both sides and an inner side of the base 181. The frame 183/183', for example, as shown in FIGS. 3A to 3D, may be provided on both sides of the base 181. Here, the frame 183/183' may be continuously provided in parallel to the length direction (x-axis direction in FIGS. 1 and 2) of the resonators 150, 160, and 170/150'. For example, the frame 183/183' may be continuously provided along both edges of the base 181.

FIG. 4 is a cross-sectional view taken along line IV-IV of FIG. 3A as an example. Referring to FIG. 4, the base 181 may have a predetermined width W, and the frame 183 may have a predetermined width W1. In addition, the frame 183 may have a predetermined height t1, and the base 181 may have a predetermined thickness t2. The predetermined thickness t2 of the base 181 may be less than the height t1 of the frame 183, but the present embodiment is not limited thereto.

By configuring the driving portion 180 of the resonator to include the base 181 and the frame 183 extending in the length direction thereof to protrude from the base 181, compared with a plate-type resonator having a thickness corresponding to a sum of the thickness of the base 181 and the height of the frame 183, a mass thereof may be reduced while maintaining the same resonant frequency of the resonator. Accordingly, a bandwidth may be widened by lowering the quality factor of the resonator, and a flatness characteristic and sound quality of the directional acoustic sensor 100 including the resonator arrangement may be improved.

Here, in order to implement a wide frequency range by using a limited number of resonators and to improve flatness characteristics, each of the resonators is required to have a wide bandwidth, and for this purpose, a quality factor of the resonators must be small. The quality factor Q of the resonator may be expressed by Equation (2) below.

$$Q=(m \times f)/c \quad (2)$$

Here, m is an effective mass, f is a resonance frequency, and c is a damping coefficient.

Referring to Equation (2), in order to reduce the quality factor while maintaining the resonant frequency of the resonator constant, it is required to reduce the mass of the resonator. When the mass of the resonator is reduced by reducing the thickness of the resonator, the length of the resonator must also be reduced to maintain the resonant frequency, and accordingly, an area of a portion receiving pressure from the input sound signal is reduced, thereby reducing the sensitivity of the directional acoustic sensor 100.

However, as in the directional acoustic sensor 100 according to the embodiment, by applying the resonators 150, 160, and 170/150' having the driving portion 180/180' including the base 181 and the frame 183/183' extending in the length direction thereof to protrude on the base 181 to the plurality of first resonators 110, the plurality of second resonators 130, and the at least one third resonator 130', the mass of each resonator may be reduced while maintaining a resonance frequency constant, and accordingly, compared to a conventional plate-type resonator, the quality factor may be reduced and the bandwidth may be increased.

As described above, in the directional acoustic sensor 100 according to the embodiment, by configuring each of the plurality of first resonators 110, the plurality of second resonators 130, and the at least one third resonator 130' to include a frame extending in the length direction thereof to protrude from the base, each resonator may have a wide bandwidth while maintaining a resonant frequency, thereby improving sensitivity and flatness characteristics, and as a result, the number of resonators may be reduced, thereby improving price competitiveness. In addition, sound quality may be improved due to the improvement of the flatness characteristic.

Referring to FIGS. 3A to 3C again, the ends 155, 165, and 175 of the driving portion 180 of the resonators 150, 160, and 170 (the first end 125 and the second end 145 in FIGS. 1 and 2) may be formed in various shapes.

As exemplarily illustrated in FIG. 3A, the end 155 of the driving portion 180 may be formed such that a width portion of one side of the resonator 150 extends in the length direction thereof, and may be formed in a plate shape up to the thickness of the frame 183. In the present embodiment, the end 155 may be formed to have a thickness t corresponding to a sum of a thickness t2 of the base 181 and a thickness t1 of the frame 183, or may be formed to have a thickness greater than the thickness t2 of the base 181 and less than the thickness t.

Figure 5A:
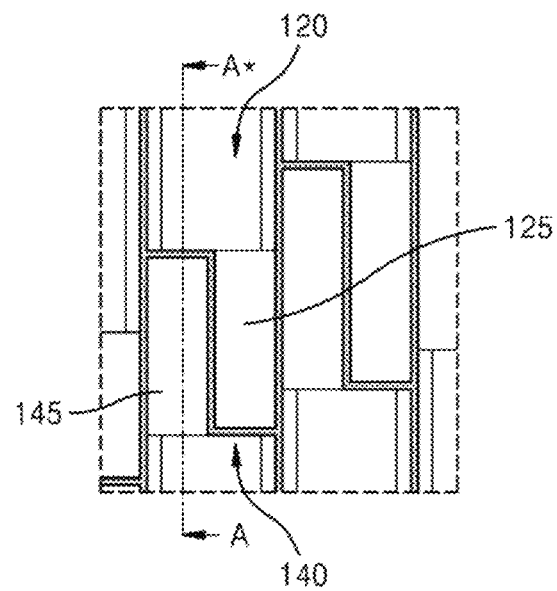
FIG. 5A is a plan view of an intersecting portion when ends of two facing resonators have plate-shaped ends according to an example embodiment.
Figure 5B:
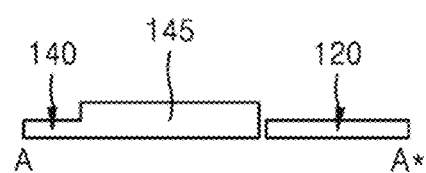
FIG. 5B is a cross-sectional view taken along line A-A* of FIG. 5A according to an example embodiment.

FIG. 5A is a plan view of an intersecting portion when ends of two facing resonators have plate-shaped ends according to an embodiment. FIG. 5B is a cross-sectional view taken along line A-A* of FIG. 5A according to an embodiment. When the resonator 150 having the end 155 of the driving portion 180 is applied as the first resonator 110 and the second resonator 130 facing each other of the directional acoustic sensor 100 according to the embodiment, as exemplarily illustrated in FIGS. 5A and 5B, the first end 125 of the first resonator 110 and the second end 145 of the second resonator 130 may be arranged in an intersecting structure in which the first end 125 and the second end 145 are engaged with each other. The first end 125 of the first resonator 110 extends in the length direction thereof to correspond to a width portion of one side of the first resonator 110, and the second end 145 of the second resonator 130 extends in the length direction thereof to correspond to a width portion of the other side of the second resonator 130 that does not face the width portion of one side of the first resonator 110. FIG. 5A is a plan view showing a portion where the first end 125 and the second end 145 intersect each other when the first end 125 of the first resonator 110 and the second end 145 of the second resonator 130 are provided with the end 155 having a plate shape as in FIG. 3A, and FIG. 5B is a cross-sectional view taken along line A-A* of FIG. 5A.

As exemplarily illustrated in FIG. 3B, the end 165 of the driving portion 180 may be formed in a structure in which a width portion of one side of the resonator 160 extends in the length direction thereof, and the frame 183 extends to the end of the extended width portion of the one side.

Figure 6A:
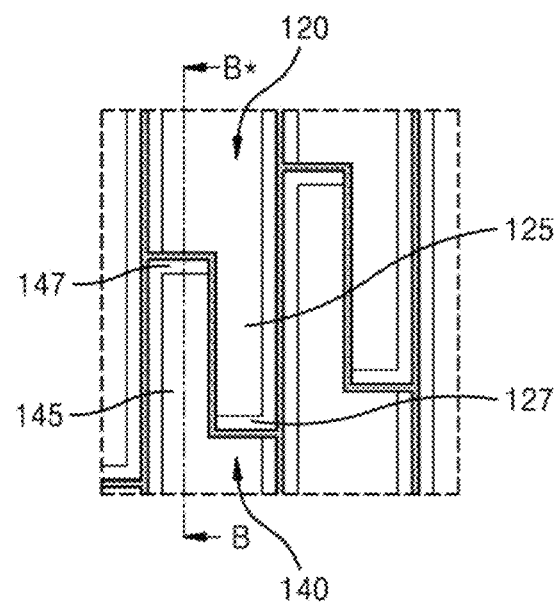
FIG. 6A is a plan view of an intersecting portion when ends of two resonators facing each other have an end with a frame extending to the end according to an example embodiment.
Figure 6B:
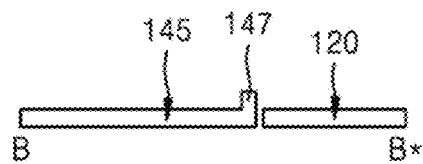
FIG. 6B is a cross-sectional view taken along line B-B* of FIG. 6A according to an example embodiment.

FIG. 6A is a plan view of an intersecting portion when ends of two resonators facing each other have an end with a frame extending to the end according to an embodiment. FIG. 6B is a cross-sectional view taken along line B-B* of FIG. 6A according to an embodiment. When the resonator 160 having the end 165 of the driving portion 180 is applied as the first resonator 110 and the second resonator 130 facing each other of the directional acoustic sensor 100 according to the embodiment, as exemplarily illustrated in FIGS. 6A and 6B, the first end 125 of the first resonator 110 and the second end 145 of the second resonator 130 may be arranged in an intersecting structure in which the first end 125 and the second end 145 are engaged with each other. The first end 125 of the first resonator 110 may have a structure in which a width portion of one side of the first end 125 of the first resonator 110 extends in the length direction thereof, and the second end 145 of the second resonator 130 may have a structure in which a width portion of other side of the second end 145 of the second resonator 130 that does not face the width portion of the one side of the first resonator 110 extends in the length direction thereof, and frames 127 and 147 may be formed to extend to the end portions of the first and second ends 125 and 145. FIG. 6A is a plan view showing an intersecting portion of the first end 125 and the second end 145 when the first end 125 of the first resonator 110 and the second end 145 of the second resonator 130 facing each other include the end 165 formed by extending the frame 183 to the end as in FIG. 3B, and FIG. 6B is a cross-sectional view taken along line B-B* of FIG. 6A.

As exemplarily illustrated in FIG. 3C, the end 175 of the driving portion 180 may be formed in a structure in which a width portion of one side of the resonator 170 extends in the length direction thereof, and the frame 183 extends to a circumference of the extended end 175.

Figure 7A:
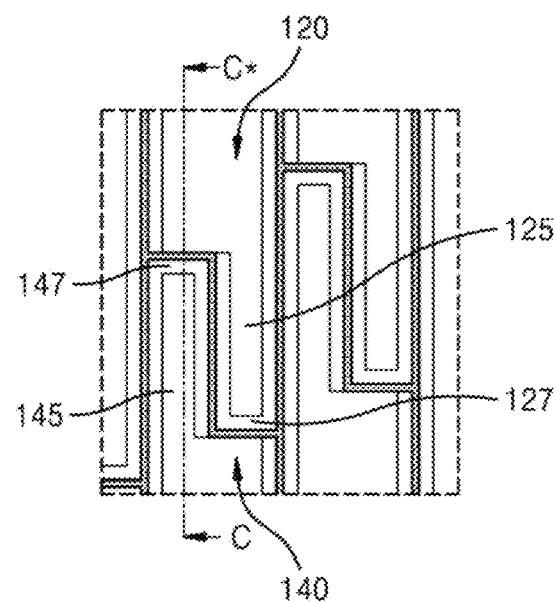
FIG. 7A is a plan view of an intersecting portion when ends of two resonators facing each other have an end with a frame extending to a circumference thereof according to an example embodiment.
Figure 7B:
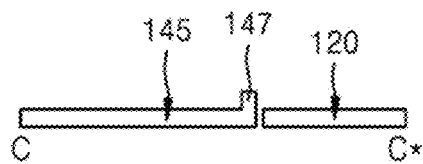
FIG. 7B is a cross-sectional view taken along line C-C* of FIG. 7A according to an example embodiment.

FIG. 7A is a plan view of an intersecting portion when ends of two resonators facing each other have an end with a frame extending to a circumference thereof according to an embodiment. FIG. 7B is a cross-sectional view taken along line C-C* of FIG. 7A according to an embodiment. When the resonator 170 having the end 175 of the driving portion 180 is applied as the first resonator 110 and the second resonator 130 facing each other of the directional acoustic sensor 100 according to the embodiment, the first end 125 of the first resonator 110 and the second end 145 of the second resonator 130 facing each other may be arranged in an intersecting structure in which the first and second ends 125 and 145 are engaged with each other as exemplarily illustrated in FIGS. 7A and 7B. The first end 125 of the first resonator 110 may have a structure in which a width portion of one side of the first resonator 110 extends in the length direction thereof, and the second end 145 of the second resonator 130 may have a structure in which a width portion of other side of the second resonator 130 that does not face the width portion of one side of the first resonator 110 extends in the length direction of the second resonator 130, and the frames 127 and 147 may extend to the circumference portion of the first end 125 and the second end 145. FIG. 7A is a plan view showing an intersecting portion of the first end 125 and the second end 145 when the first end 125 of the first resonator 110 and the second end 145 of the second resonator 130 facing each other include the end 175 in which the frame 183 is formed by extending to a circumference of the end 175 as shown in FIG. 3C, and FIG. 7B is a cross-sectional view taken along line C-C* of FIG. 7A.

When the resonators 150, 160, and 170 having the ends 155, 165, and 175 of the shape as exemplarily illustrated in FIGS. 3A to 3C are applied to the first resonator 110 and the second resonator 130 facing each other of the directional acoustic sensor 100 according to the embodiment, the intersecting structure in which the first and second ends 125 and 145 are engaged with each other may be formed to a thickness reaching a height of the frame as in FIGS. 5A and 5B, or the frames 127 and 147 may be formed to extend to at least a portion of the engaged intersecting portion of the first and second ends 125 and 145 as in FIGS. 6A and 6B and as in FIGS. 7A and 7B.

FIGS. 1 and 2 illustrate an example in which the structure of FIGS. 5A and 5B is applied as an intersecting structure of the first and second ends 125 and 145 engaged each other. Alternatively, the structure of FIGS. 6A and 6B or the structure of FIGS. 7A and 7B may be applied as the intersecting structure of the first and second ends 125 and 145 engaged each other.

In FIGS. 1, 2, 3A, 3B, and 3C, it is illustrated that the frame 183 does not extend to the end of the base 181 where the first end 125 of the driving portion 120 of the first resonator 110 and the second end 145 of the driving portion 140 of the second resonator 130 are not located, but this is merely an example, and the embodiment is not limited thereto. That is, the frame 183 may extend to the end of the base 181 where the first end 125 and the second end 145 are not located.

In addition, in FIGS. 1, 2, 3A, 3B, and 3C, it has been described and illustrated that the driving portions 120 and 140 of the first resonator 110 and the second resonator 130 have a structure including the base 181 and the frame 183 protruding from the base 181, but this is merely an example, and the embodiment is not limited thereto. For example, the driving portions 120 and 140 of the first resonator 110 and the second resonator 130 may be formed in a structure without the frame 183.

Figure 8:
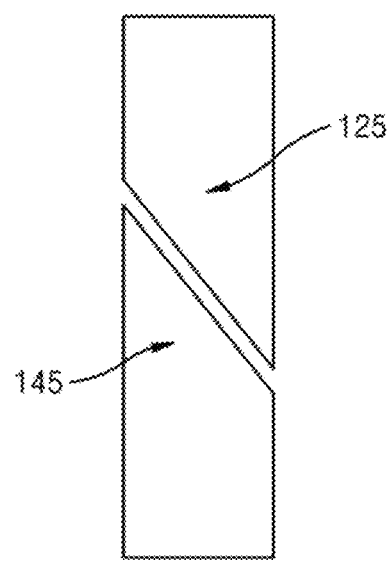
FIG. 8 is a diagram of an example of forming an intersecting structure in which ends of two resonators facing each other are engaged with each other in an edge shape according to an example embodiment.
Figure 9:
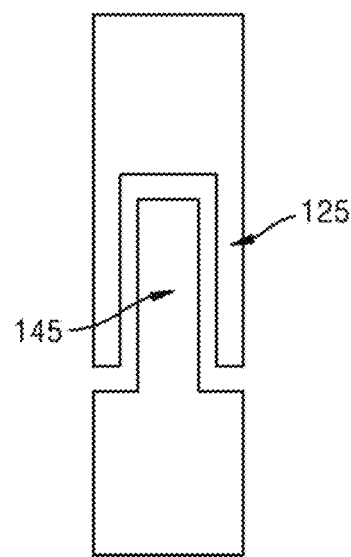
FIG. 9 is a diagram of an example of forming an intersecting structure in which ends of two resonators facing each other are engaged with each other in a male/female form according to an example embodiment.

FIG. 8 is a diagram of an example of forming an intersecting structure in which ends of two resonators facing each other are engaged with each other in an edge shape according to an embodiment. FIG. 9 is a diagram of an example of forming an intersecting structure in which ends of two resonators facing each other are engaged with each other in a male/female form according to an embodiment. In the above description, it has been described a case in which, at the intersecting portion of the first end 125 and the second end 145, the width portion of the one side of the first resonator 110 and the width portion of the other side of the second resonator 130 that face each other extend in the length direction thereof to form an intersecting structure in which the first end 125 and the second end 145 are engaged with each other, but the embodiment is not limited thereto. For example, as shown in FIG. 8, the first end 125 and the second end 145 may be formed in an intersecting structure that engages with each other in an edge shape. In addition, an intersecting portion where the first and second ends 125 and 145 are engaged with each other may be formed to have an intersecting structure in which the first end 125 and the second end 145 are engaged with each other in a male/female shape, as shown in FIG. 9. The male/female shape of the first end 125 and the second end 145 may be formed opposite to that in FIG. 9. Also, in FIGS. 8 and 9, the first end 125 and the second end 145 may be formed in a plate-shape with a thickness reaching the height of the frame, or may be formed in a structure in which the frame extends to at least a portion of the intersecting portions of the first and second ends 125 and 145. In FIGS. 8 and 9, the specific structure of the intersecting portions of the first end 125 and the second end 145 engaged with each other may be inferred from FIGS. 5A and 5B, FIGS. 6A and 6B, and FIGS. 7A and 7B, and thus, repeated descriptions and illustrations thereof are omitted.

In the embodiment described above, as an example, it is depicted that the directional acoustic sensor 100 according to the embodiment has a resonator arrangement including a plurality of first resonators 110, a plurality of second resonators 130, and at least one third resonator 130', and in FIGS. 1 and 2, the directional acoustic sensor 100 includes a total of 16 resonators by including seven first and second resonators 110 and 130 respectively forming a resonator arrangement to face each other, respectively, and two third resonator 130' that does not face the first resonator 110, and the embodiment is not limited thereto.

According to the directional acoustic sensor 100 according to the embodiment as described above, the first end 125 of the first resonator 110 and the second end 145 of the second resonator 130 that face each other in the resonator arrangement form an intersecting structure in which the first end 125 and the second end 145 are engaged with each other, and thus, a through-hole in the cavity may be minimized or virtually eliminated in an arrangement region where the resonators face each other. Accordingly, in the directional acoustic sensor 100 according to the embodiment, a decrease in acoustic resistance may be suppressed, such that sensitivity may be improved, and a layout size of a resonator arrangement may be reduced, such that a device size may be reduced.

On the other hand, when the ends of the resonators facing each other are disposed without an intersecting structure, there may be a through-hole between the two facing resonators, whereby the acoustic resistance is reduced, and as a result, the sensitivity may be reduced than that of the directional acoustic sensor 100 according to the embodiment.

Figure 10:
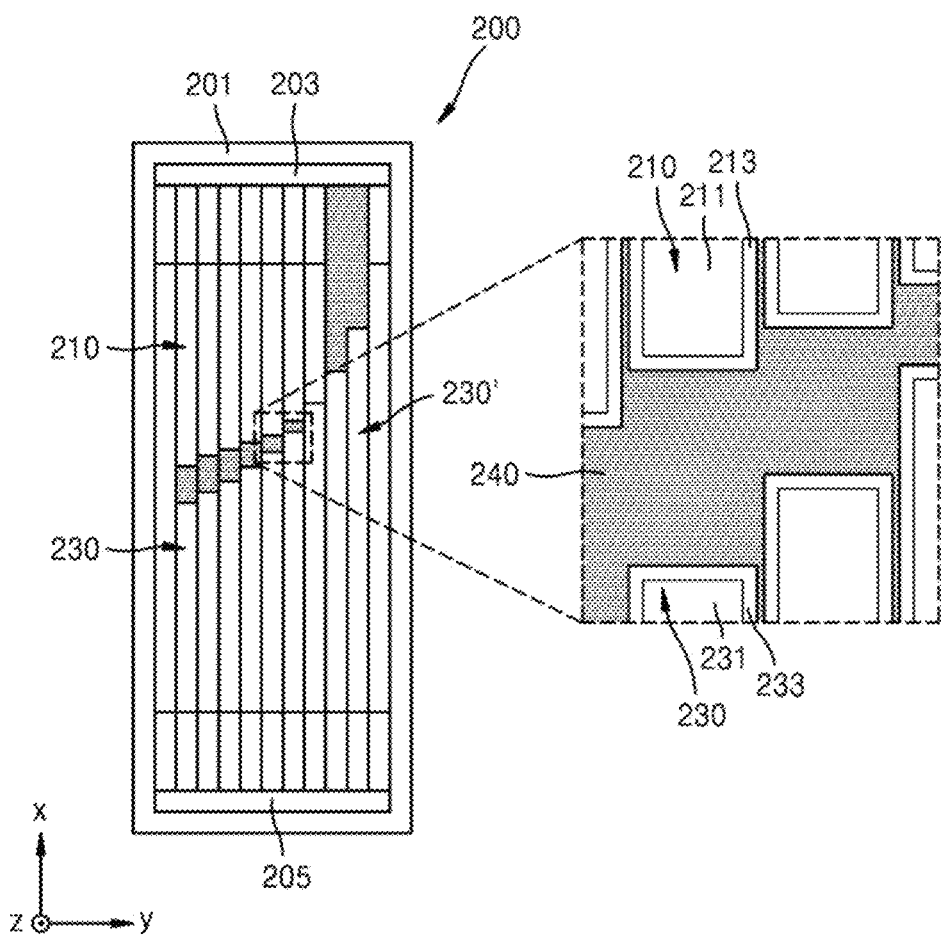
FIG. 10 is a schematic plan view illustrating a directional acoustic sensor according to a comparative example.

FIG. 10 is a schematic plan view illustrating a directional acoustic sensor according to a comparative example. FIG. 10 shows an example in which the directional acoustic sensor 200 according to the comparative example is provided to compare to the directional acoustic sensor 100 according to the embodiment of FIG. 2.

Referring to FIG. 10, the directional acoustic sensor 200 of the comparative example includes a support 201, and a plurality of first resonators 210 and a plurality of second resonators 230 provided on the support 201. The plurality of first resonators 210 and the plurality of second resonators 230 are arranged to form a resonator arrangement in which at least some of them face each other in a cavity of the support 201.

One end of each of the plurality of first resonators 210 is fixed to the first support portion 203 of the support 201 to form a planarly parallel arrangement in the cavity of the support 201. One end of each of the plurality of second resonators 230 is fixed to the second support 205 of the support 201 to form a planarly parallel arrangement in the cavity of the support 201.

When compared with the directional acoustic sensor 100 according to the embodiment shown in FIG. 2, the directional acoustic sensor 200 of the comparative example does not have an intersecting structure of ends of the first resonator 210 and the second resonator 230 facing each other. In FIG. 10, reference numeral 230' denotes a second resonator that does not face the first resonator 210.

Each of the plurality of first resonators 210 and the plurality of second resonators 230 include bases 211 and 231 and frames 213 and 233 extending in a length direction thereof to protrude from the bases 211 and 231, and the frames 213 and 233 extend to end portions of the first resonator 210 and the second resonator 230.

In the directional acoustic sensor 200 of the comparative example, the first resonator 210 and the second resonator 230 facing each other do not have an intersecting structure of ends, there may be a through hole 240 of the cavity between the first resonator 210 and the second resonator 230 facing each other.

Figure 11:
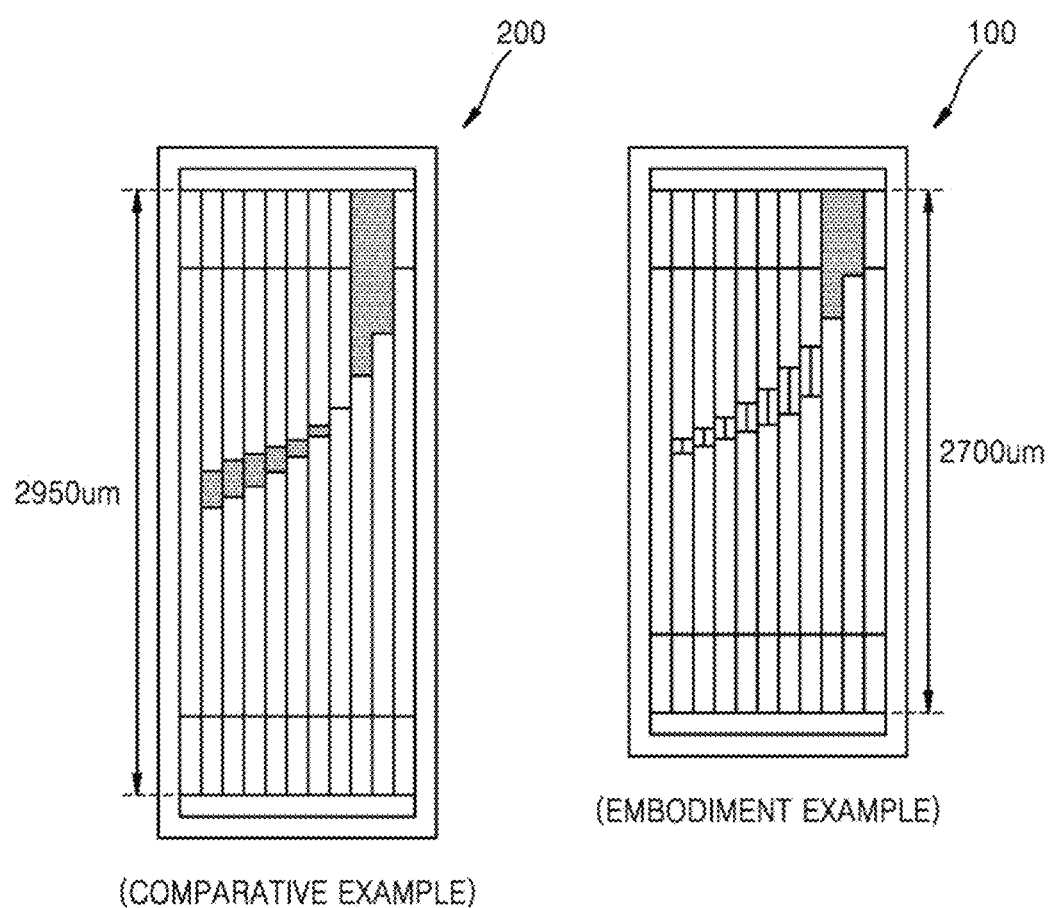
FIG. 11 is a diagram of a comparison of a layout size change of a resonator arrangement before and after the application of the intersecting structure of ends of two resonators facing each other according to an example embodiment.

FIG. 11 is a diagram of a comparison of a change of a layout size of a resonator arrangement before (comparative example) and after (embodiment example) application of the intersecting structure of ends of two resonators facing each other according to an embodiment. In FIG. 11, when the resonant frequency change before (comparative example) and after (embodiment example) a change of the shape of the ends of the two facing resonators is limited to about 5% or less, a design example in which the size of device in the length direction thereof is reduced from approximately 2950 μm to approximately 2700 μm is shown. When not limiting the resonant frequency change, the ends that constitute an intersecting structure may be formed up to approximately half the length of the resonator.

In FIG. 11, a layout of the resonator arrangement before applying the intersecting structure of the two facing resonators corresponds to the directional acoustic sensor 200 of the comparative example shown in FIG. 10, and a layout of the resonator arrangement after the application of the intersecting structure of the ends of the two facing resonators corresponds to the directional acoustic sensor 100 according to the embodiment shown in FIG. 2.

As shown in FIG. 11, the directional acoustic sensor 100 according to the embodiment to which an intersecting structure of the ends of the two resonators facing each other is applied has a reduced layout size of the resonator arrangement by about 10% compared to the directional acoustic sensor 200 of the comparative example to which the intersecting structure of the ends is not applied. Therefore, according to the directional acoustic sensor 100 according to the embodiment, the size of the device may be reduced, and thus, price competitiveness may be improved.

Figure 12:
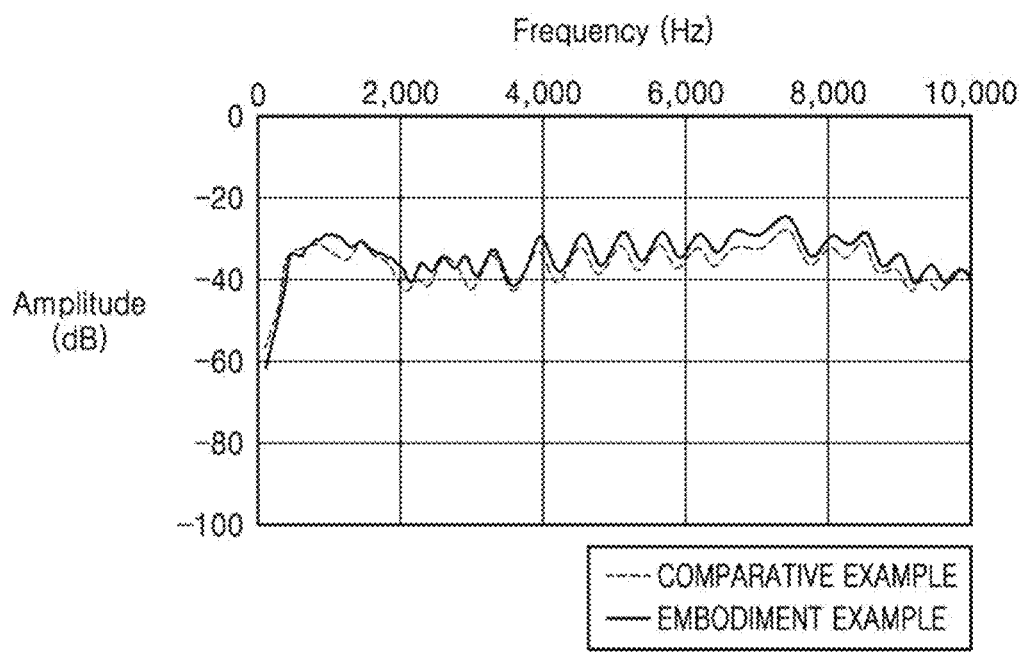
FIG. 12 is a graph showing changes in the frequency response characteristics of resonators before and after the application of the intersecting structure of ends of two resonators facing each other according to an example embodiment.

FIG. 12 is a graph showing the change in frequency response characteristics of resonators before (comparative example) and after (embodiment example) application of an intersecting structure of ends of two resonators facing each other according to an embodiment.

As shown in FIG. 12, it may be seen that the sensitivity increases by about 2.4 dB when the intersecting structure of the ends of the two resonators facing each other is applied. As such, according to the directional acoustic sensor 100 according to the embodiment, due to the intersecting structure of the ends of the two facing resonators, there is almost no through-hole between the two facing resonators, and thus, the decrease in acoustic resistance is suppressed, thereby increasing the sensitivity.

Figure 13:
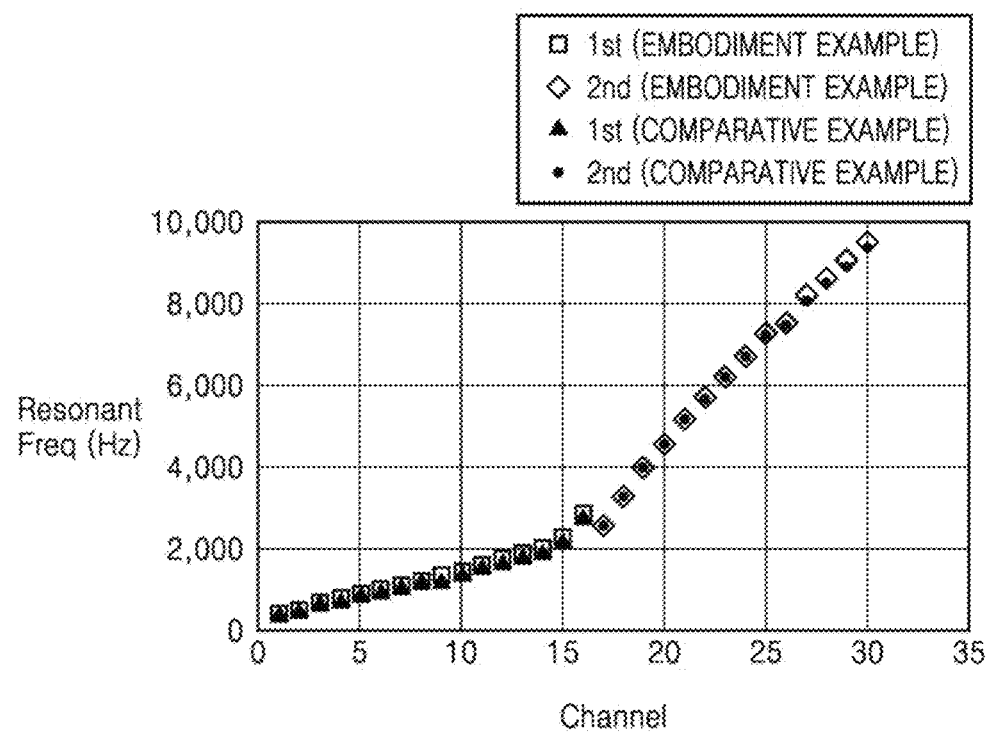
FIG. 13 is a graph showing resonant frequency characteristics for each channel of the resonator arrangement before and after the application of the intersecting structure of the ends of two resonators facing each other according to an example embodiment.

FIG. 13 is a graph showing resonant frequency characteristics for each channel of a resonator arrangement before (comparative example) and after (embodiment example) the application of an intersecting structure of ends of two resonators facing each other. The channel represents each resonator, and when width, thickness, and mass conditions are the same, the resonant frequency of each channel (resonator) is approximately proportional to the square root of a beam length of the resonator. The resonance frequency graph of FIG. 13 is a result obtained through COMSOL simulation.

As shown in FIG. 13, it may be seen that, even when an intersecting structure of ends of two resonators facing each other is applied, a directional acoustic sensor with almost no change in primary and secondary resonant frequencies may be implemented.

From the difference in layout size of the resonator arrangement before (comparative example) and after (embodiment example) application of the intersecting structure of the ends of the two resonators facing each other as in FIG. 11, the frequency response characteristics of the resonator in FIG. 12, and the resonant frequency characteristics for each channel of FIG. 13, by applying an intersecting structure of ends of two resonators facing each other to a directional acoustic sensor, it may be seen that a directional acoustic sensor having good sensitivity and desired resonant frequency characteristics for each channel may be implemented, and a device size may be reduced. FIGS. 11 to 13 are only illustrative, and the embodiment is not limited thereto.

Figure 14:
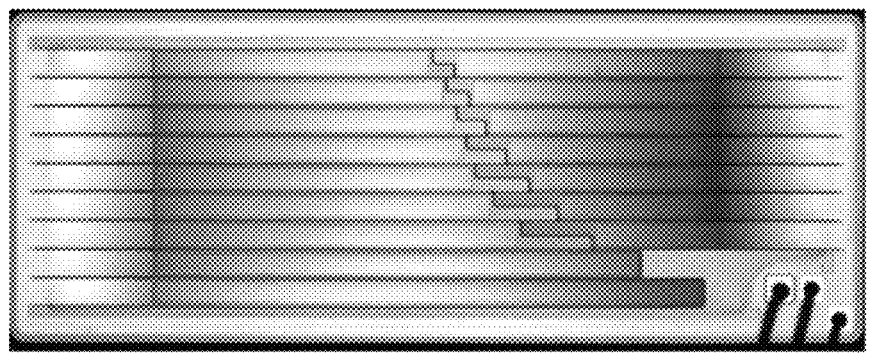
FIG. 14 is a sample photograph after fabrication of a directional acoustic sensor according to an embodiment.
Figure 15:
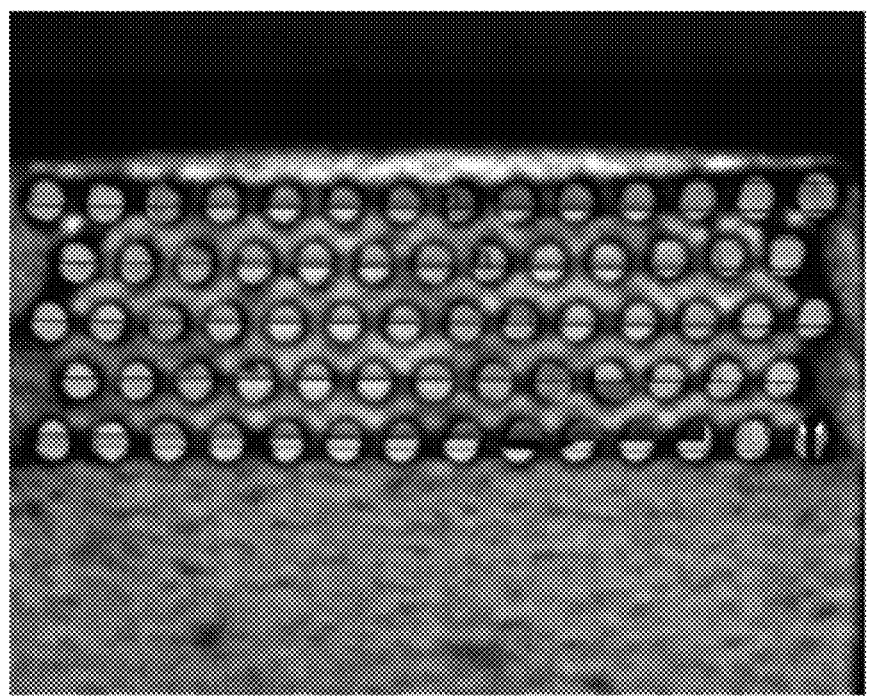
FIG. 15 is a photograph after packaging the directional acoustic sensor of FIG. 14 according to an example embodiment.

The directional acoustic sensor 100 according to the embodiment may be manufactured, for example, as shown in FIG. 14, and may be packaged as shown in FIG. 15.

Figure 16:
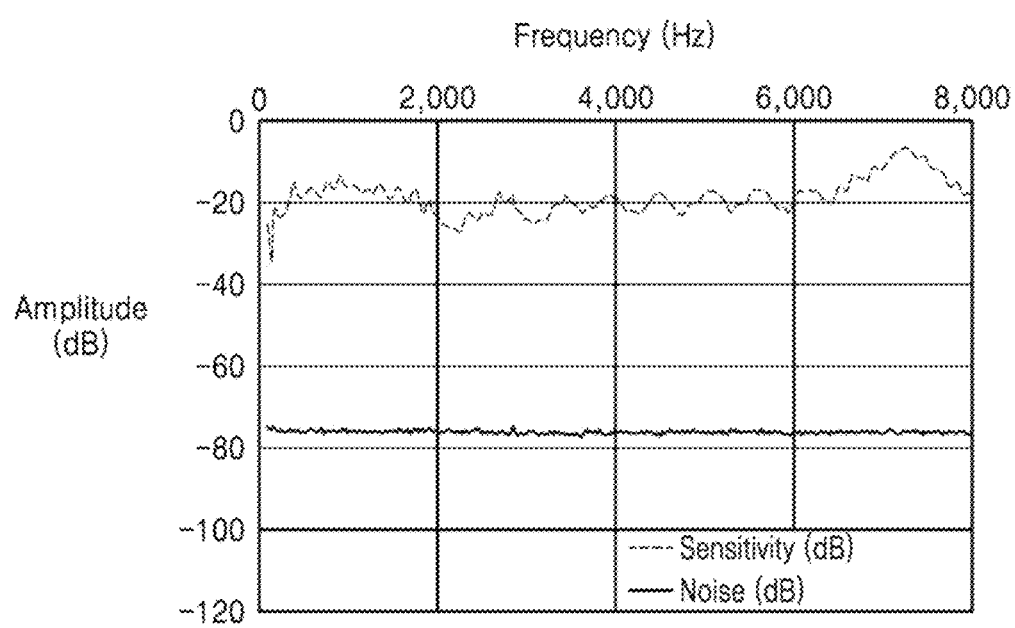
FIG. 16 is a graph showing a result of measuring the frequency response characteristics of a directional acoustic sensor according to a manufactured example embodiment.

FIG. 14 is a photograph after manufacturing the directional acoustic sensor 100 according to the embodiment. FIG. 15 is a photograph after packaging the directional acoustic sensor 100 of FIG. 14 according to an embodiment. FIG. 15 shows an example in which holes are formed in a packaging case such that acoustic sound is transmitted to the directional acoustic sensor 100. FIG. 16 is a graph showing a result of measuring a frequency response characteristic of the directional acoustic sensor 100 according to the manufactured embodiment. It may be confirmed from the measurement result of FIG. 16 that the device size may be reduced without decreasing in sensitivity. Here, FIGS. 14 to 16 are only illustrative, and the present embodiment is not limited thereto, and the directional acoustic sensor 100 according to the embodiment may be modified to have various frequency response characteristics.

In the above, a resonator having a structure including a base and a frame extending along both edges of the base in the length direction thereof to protrude from the base has been described as the first resonator 110 and the second resonator 130 facing each other in the directional acoustic sensor 100 according to the embodiment, but the embodiment is not limited thereto, and resonators having various structures may be applied.

Figure 17:
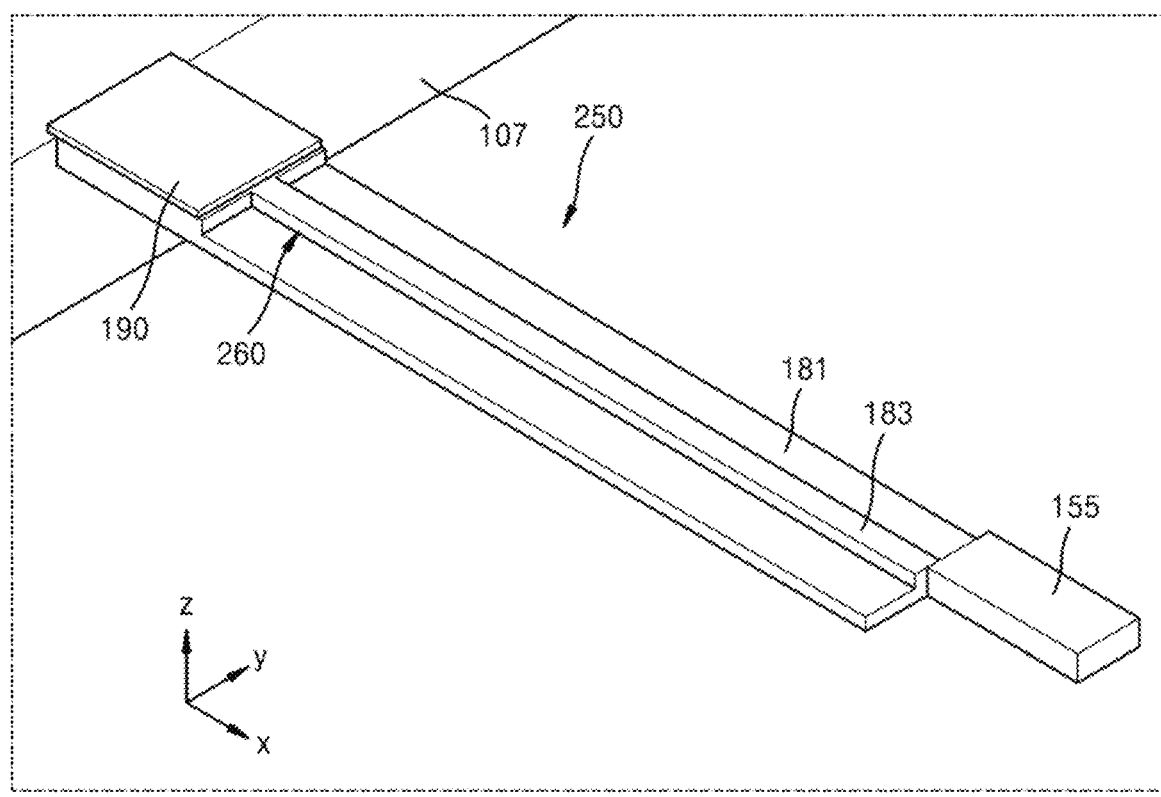
FIGS. 17, 18 and 19 are diagrams of resonators that may be applied to two resonators facing each other according to example embodiments.
Figure 18:
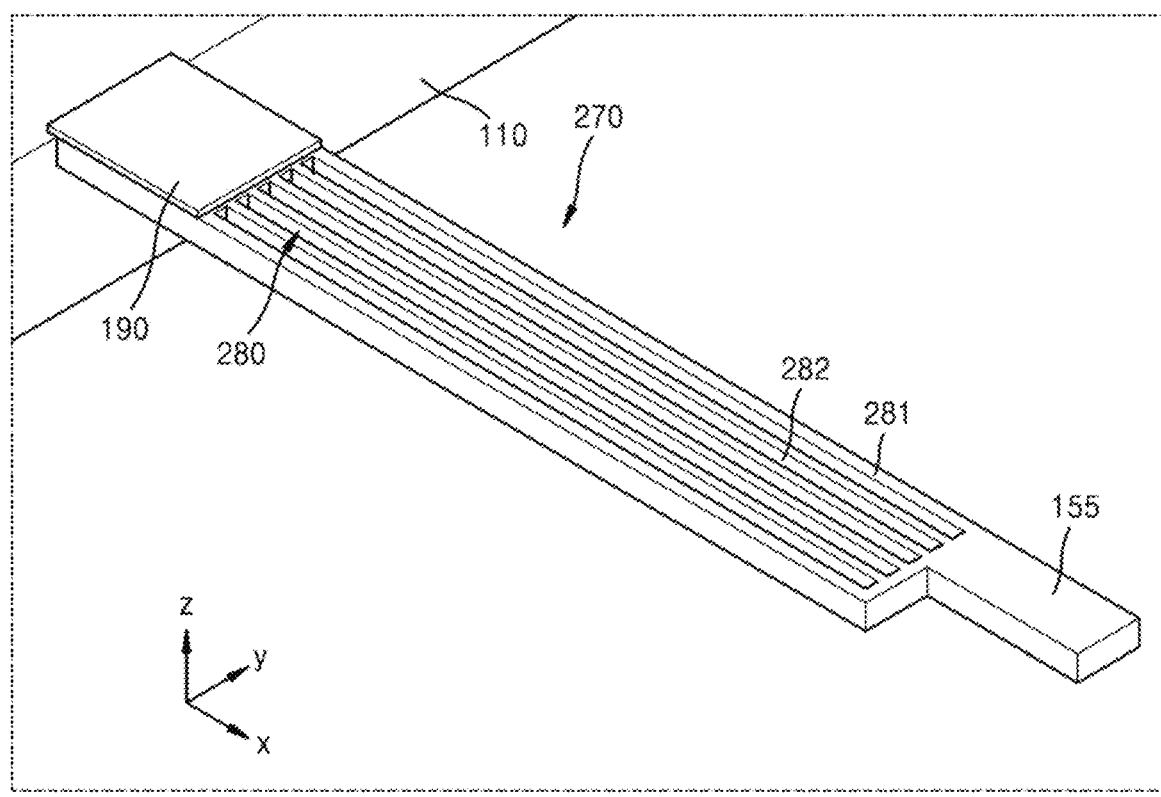
Figure 19:
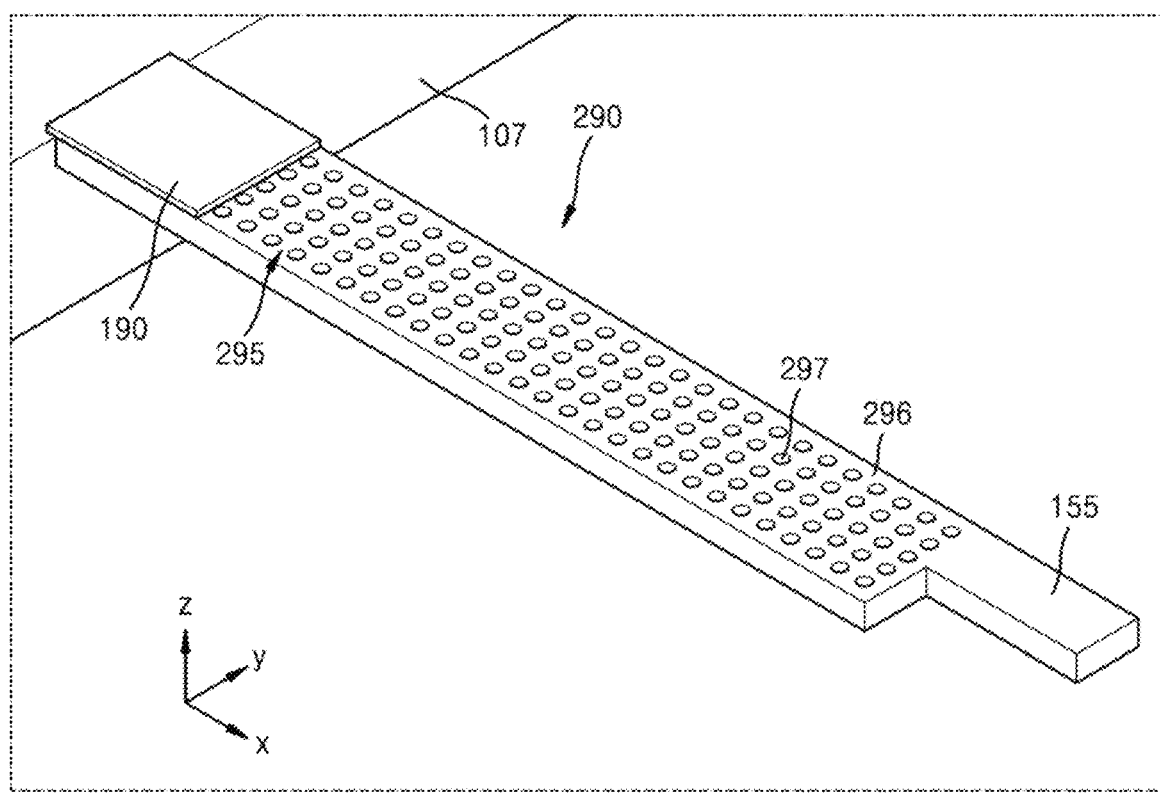
Figure 20:
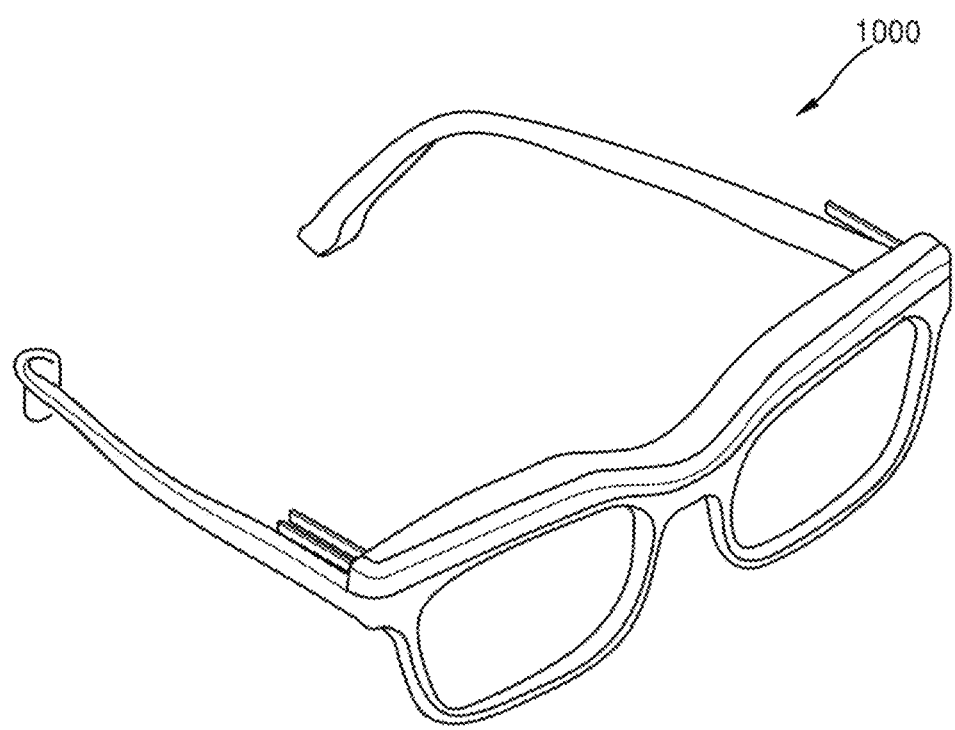
FIGS. 20, 21, 22, 23, 24 and 25 are diagrams of electronic devices to which the directional acoustic sensor according to an embodiment is applied as a voice interface device according to example embodiments.
Figure 21:
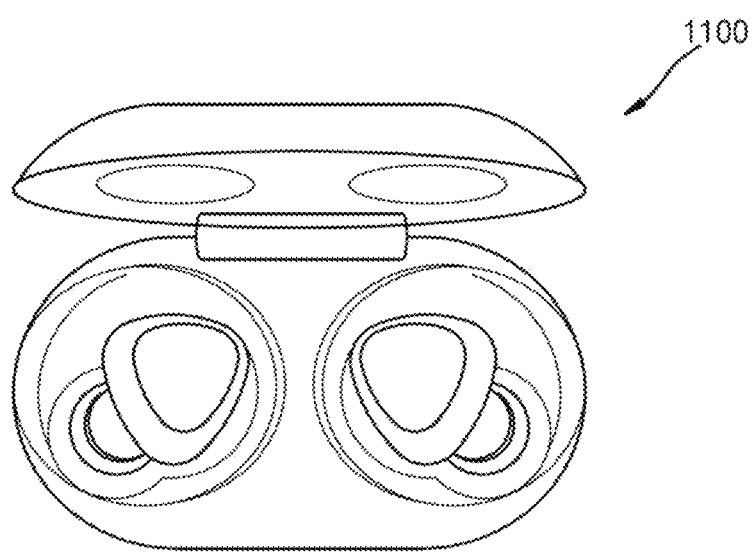
Figure 22:
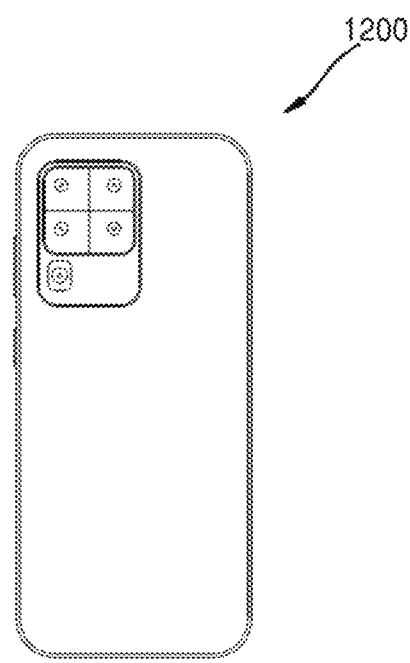
Figure 23:
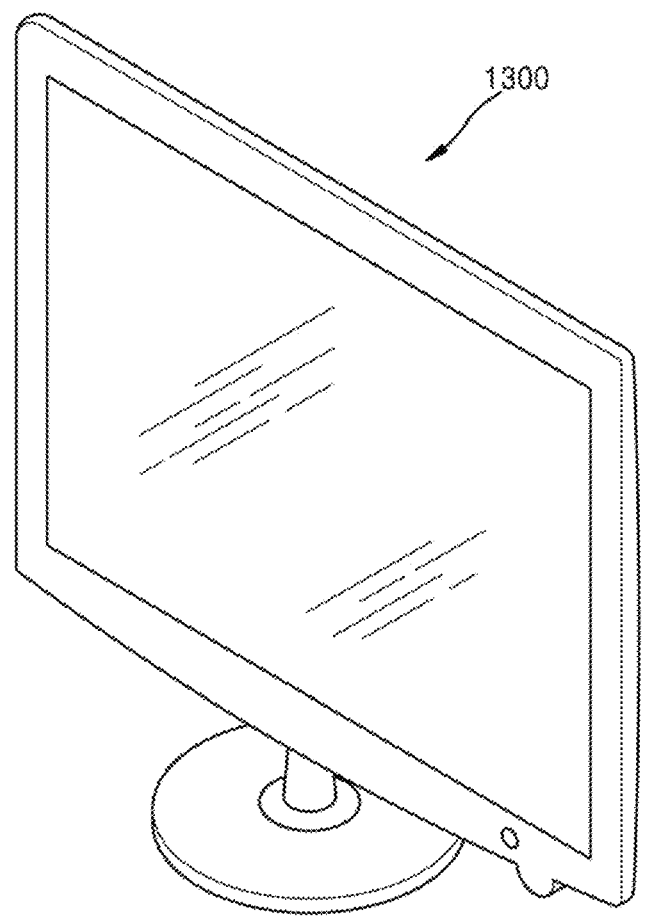
Figure 24:
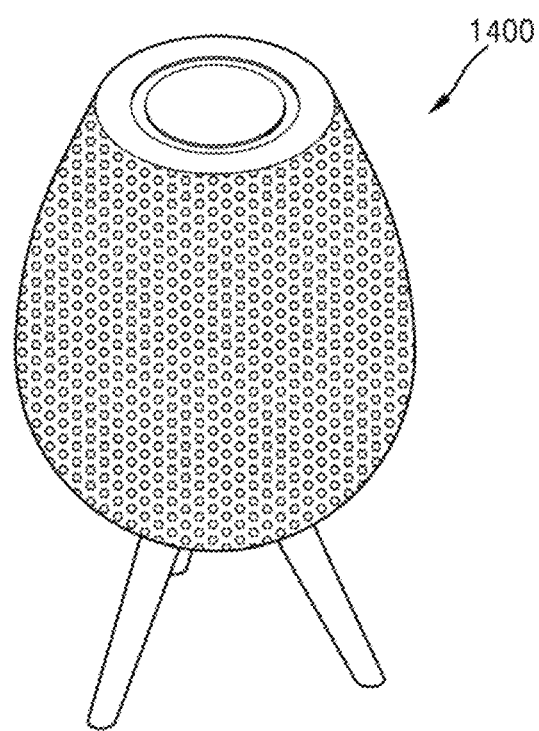

FIGS. 17, 18 and 19 are diagrams of other examples of resonators that may be applied to two resonators facing each other according to an embodiment. FIGS. 17 to 19 illustrate other examples of resonators 250, 270, and 290 that may be applied as the first resonator 110 and the second resonator 130 facing each other in FIGS. 1 and 2.

Referring to FIG. 17, a driving portion 260 of the resonator 250 may include a base 181 and a frame 183 protruding from the base 181 and extending in the length direction thereof. Also, the driving portion 260 of the resonator 250 may have an end 155 (e.g., corresponding to the first end 125 and the second end 145 in FIGS. 1 and 2) at the end thereof.

The frame 183 may be continuously provided parallel to the length direction of the resonator 250 inside the base 181. In FIG. 17, a case in which only one frame 183 is provided is illustrated as an example, but the embodiment is not limited thereto, and a plurality of frames 183 may be provided inside the base 181.

Referring to FIG. 18, a driving portion 280 of the resonator 270 may include a base 281 and a groove pattern 282 having a predetermined depth in the base 281. Also, the driving portion 280 of the resonator 270 may have an end 155 (corresponding to the first end 125 and the second end 145 in FIGS. 1 and 2) at the end thereof.

The groove pattern 282 may be formed in a regular shape on the base 281. Here, the groove pattern 282 is formed in the base 281 to a predetermined depth, thereby reducing the mass of the resonator compared to a resonator having only the base without the groove pattern.

The resonator 270 according to the present embodiment includes the groove pattern 282 formed to a predetermined depth in the base 281, thereby reducing the mass of the resonator 270 while maintaining the resonant frequency constant, and accordingly, a quality factor may be reduced and a bandwidth may be increased compared to a resonator including only a base without a groove pattern.

Referring to FIG. 19, a driving portion 295 of a resonator 290 may include a base 296 and a plurality of through holes 297 formed through the base 296. The plurality of through-holes 297 may be formed in a regular shape in the base 296. In addition, the driving portion 295 of the resonator 290 may have an end 155 (corresponding to the first end 125 and the second end 145 in FIGS. 1 and 2) at the end thereof.

The resonator 290 shown in FIG. 19 may have the same resonant frequency as a resonator in which a plurality of through holes are not formed. To this end, each through hole 297 may be formed to have a size smaller than the wavelength of an audible frequency band.

In the present embodiment, the resonator 290 includes a plurality of through-holes 297 having a size smaller than a wavelength of an audible frequency band formed in the base 296, thereby reducing the mass of the resonator while maintaining the resonant frequency constant, and accordingly, compared to a resonator that does not include a plurality of through-holes, a quality factor may be reduced and a bandwidth may be increased.

In FIGS. 17, 18, and 19, the resonators 250, 270, and 290 are illustrated as having plate-shaped ends 155 at the ends of the driving portions 260, 280, and 295, but the embodiment is not limited thereto, and the shapes of the ends may be modified in various forms as described above.

On the other hand, the resonators 250, 270, and 290 of FIGS. 17, 18, and 19 may also be applied to the third resonator 130' that does not face the first resonator 110 in FIGS. 1 and 2, and in this case, the structure may be changed to a structure without the end 155, or a structure including the end 155 may be applied as it is.

The directional acoustic sensor 100 according to the embodiment as described above may reduce or eliminate through-holes caused by the arrangement of the resonators having different lengths from each other by forming ends of two facing resonators to an intersecting structure engaged each other, thereby, improving the acoustic sensitivity and reducing the device size.

The directional acoustic sensor 100 according to the embodiment described above may be applied to various electronic devices to which a voice interface technology is applied, for example, a smart phone, a foldable phone, an AI speaker, AR glasses, wearable devices, robots, TVs, etc.

Figure 25:
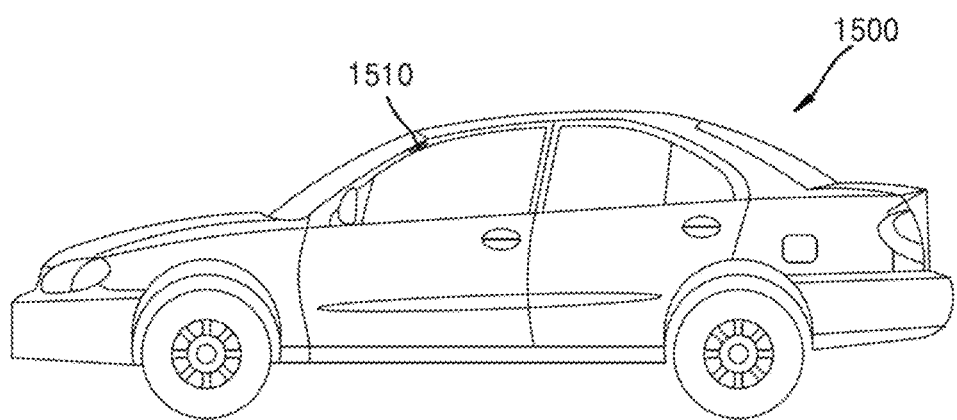

FIGS. 20, 21, 22, 23, 24 and 25 are diagrams of examples of electronic devices to which the directional acoustic sensor according to an embodiment is applied as a voice interface device according to an embodiment. For example, the directional acoustic sensor 100 according to the embodiment may be applied to AR glasses 1000, earbuds 1100, smart phones 1200, TVs 1300, artificial intelligent speakers 1400, and the like as shown in FIGS. 20 to 24. Also, the directional acoustic sensor 100 according to the embodiment may be applied to a vehicle 1500 as shown in FIG. 25. FIG. 25 shows an example in which the directional acoustic sensor 1510 according to the embodiment is provided on an upper side of the windshield, and besides above, the directional acoustic sensor 1510 according to the embodiment may be mounted at various positions inside and outside the vehicle 1500. In addition, the directional acoustic sensor 100 according to the embodiment may be applied to various electronic devices including household appliances, such as air conditioners, refrigerators, and air purifiers. Although the embodiments have been described above, this is merely examples, and various modifications are possible to those skilled in the art from the above description.

According to the directional acoustic sensor according to the embodiment, by forming ends of two facing resonators in an intersecting structure, a through-hole of a cavity in an arrangement region facing resonators may be minimized, and thus a directional acoustic sensor with improved sensitivity may be realized.

In addition, by forming the ends of the two resonators in an intersecting structure, the size of the resonator arrangement region may be reduced, thereby reducing the device size.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A directional acoustic sensor comprising:
    a support comprising a first support portion and a second support portion that are separated from each other and face each other;
    a plurality of first resonators extending in a length direction thereof from the first support portion of the support, each first resonator of the plurality of first resonators comprising:
        a first end fixed to the first support portion and having a first width at a position where the first end is fixed to the first support portion;
        a base and a frame extending from the first end, wherein the frame extends to a first height and the base has a thickness that is less than the first height; and
        a second end opposite the first end that is fixed to the first support portion and having a second width less than the first width; and
    a plurality of second resonators extending in the length direction thereof from the second support portion of the support and facing the plurality of first resonators, each second resonator of the plurality of second resonators comprising:
        a first end fixed to the second support portion and having a third width at a position where the first end is fixed to the second support portion;
        a base and a frame extending from the first end, wherein the frame extends to the first height and the base has a thickness that is less than the first height; and
        a second end opposite the first end that is fixed to the second support portion and having a fourth width less than the third width,
    wherein, in a first resonator arrangement of a region where the plurality of first resonators and the plurality of second resonators face each other, the second ends of the plurality of first resonators and the second ends of the plurality of second resonators form an intersecting structure.

2. The directional acoustic sensor of claim 1, wherein the second end of each first resonator of the plurality of first resonators has a structure in which a width portion of each first resonator extends in the length direction thereof, and
    wherein the second end of each second resonator of the plurality of second resonators has a structure in which a width portion of each second resonator that does not face the width portion of a corresponding first resonator extends in the length direction thereof.

3. The directional acoustic sensor of claim 2, wherein the second ends of the plurality of first resonators and the second ends of the plurality of second resonators respectively engage with each other.

4. The directional acoustic sensor of claim 2, wherein the second ends of the plurality of first resonators and the second ends of the plurality of second resonators respectively engage with each other in a male or female form.

5. The directional acoustic sensor of claim 1, wherein, in each first resonator of the plurality of first resonators and each second resonator in the plurality of second resonators, the frame is integrally formed with the base.

6. The directional acoustic sensor of claim 1, wherein, in each first resonator of the plurality of first resonators and each second resonator in the plurality of second resonators, each of the base and the frame comprises silicon.

7. The directional acoustic sensor of claim 1, wherein, in each first resonator of the plurality of first resonators and each second resonator in the plurality of second resonators, the frame is provided on at least one of both sides and an inside of the base.

8. The directional acoustic sensor of claim 1, wherein each the second ends of the plurality of first resonators and the second ends of the plurality of second resonators has a plate shape up to the first height.

9. The directional acoustic sensor of claim 1, wherein, in each first resonator of the plurality of first resonators and each second resonator in the plurality of second resonators, the base and the frame respectively extend to each of the second ends of the plurality of first resonators and each of the second ends of the plurality of second resonators.

10. The directional acoustic sensor of claim 1 the frame of each first resonator and the frame of each second resonator extends to end portions of the second end of each first resonator and the second end of each second resonator, respectively.

11. The directional acoustic sensor of claim 1, wherein the frame of each first resonator and the frame of each second resonator extends to a circumference of the second end of each first resonator and the second end of each second resonator, respectively.

12. The directional acoustic sensor of claim 1, further comprising at least one third resonator extending in the length direction thereof from the first support portion or the second support portion of the support and not facing the plurality of first resonators or the plurality of second resonators.

13. The directional acoustic sensor of claim 12, wherein the at least one third resonator comprises:
a base; and
a frame protruding from the base and extending in the length direction thereof.

14. The directional acoustic sensor of claim 1, wherein each first resonator of the plurality of first resonators and each second resonator of the plurality of second resonators comprises:
a driving portion configured to move in response to an input sound signal; and
a sensing portion configured to detect movement of the driving portion.

15. The directional acoustic sensor of claim 14, wherein the second ends of each first resonator of the plurality of first resonators and each second resonator of the plurality of second resonators is configured to move freely.

16. The directional acoustic sensor of claim 14, wherein the plurality of first resonators and the plurality of second resonators have resonant frequencies different from each other.

17. An electronic device comprising:
a directional acoustic sensor comprising:
a support comprising a first support portion and a second support portion that are separated from each other and face each other;
a plurality of first resonators extending in a length direction thereof from the first support portion of the support, each first resonator of the plurality of first resonators comprising:
a first end fixed to the first support portion and having a first width at a position where the first end is fixed to the first support portion;
a base and a frame extending from the first end, wherein the frame extends to a first height and the base has a thickness that is less than the first height; and
a second end opposite the first end that is fixed to the first support portion and having a second width less than the first width; and
a plurality of second resonators extending in the length direction thereof from the second support portion of the support and facing the plurality of first resonators, each second resonator of the plurality of second resonators comprising:
a first end fixed to the second support portion and having a third width at a position where the first end is fixed to the second support portion;
a base and a frame extending from the first end, wherein the frame extends to the first height and the base has a thickness that is less than the first height; and
a second end opposite the first end that is fixed to the second support portion and having a fourth width less than the third width,
wherein, in a first resonator arrangement of a region where the plurality of first resonators and the plurality of second resonators face each other, the second ends of the plurality of first resonators and the second ends of the plurality of second resonators form an intersecting structure.

18. The electronic device of claim 17, wherein the directional acoustic sensor further comprises at least one third resonator extending in the length direction thereof from the first support portion or the second support portion of the support and not facing the plurality of first resonators or the plurality of second resonators.

19. The electronic device of claim 18, wherein the at least one third resonator comprises:
a base; and
a frame protruding from the base and extending in the length direction thereof.

20. The electronic device of claim 17, wherein each first resonator of the plurality of first resonators and each second resonator of the plurality of second resonators comprises:
a driving portion configured to move in response to an input sound signal, and
a sensing portion configured to detect movement of the driving portion.

21. The electronic device of claim 20, wherein the second ends of each first resonator of the plurality of first resonators and each second resonator of the plurality of second resonators are configured to move freely.

22. The electronic device of claim 20, wherein the plurality of first resonators and the plurality of second resonators have resonant frequencies different from each other.

23. A directional acoustic sensor comprising:
a support;
a plurality of first resonators extending in a length direction thereof from the support, each first resonator of the plurality of first resonators comprising:
a first end fixed to the support and having a first width at a position where the first end is fixed to the support;
a base and a frame extending from the first end, wherein the frame extends to a first height and the base has a thickness that is less than the first height; and
a second end opposite the first end that is fixed to the support and having a second width less than the first width; and
a plurality of second resonators extending in the length direction thereof from the support and facing the plurality of first resonators, each second resonator of the plurality of second resonators comprising:
a first end fixed to the support and having a third width at a position where the first end is fixed to the support;
a base and a frame extending from the first end, wherein the frame extends to the first height and the base has a thickness that is less than the first height; and
a second end opposite to the first end that is fixed to the support and having a fourth width less than the third width,
wherein the second ends of the plurality of first resonators and the second ends of the plurality of second resonators form an intersecting structure.

* * * * *